(12) United States Patent
Kitagawa et al.

(10) Patent No.: US 7,479,679 B2
(45) Date of Patent: Jan. 20, 2009

(54) FIELD EFFECT TRANSISTOR AND APPLICATION DEVICE THEREOF

(75) Inventors: Mitsuhiko Kitagawa, Tokyo (JP); Yoshiaki Aizawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 263 days.

(21) Appl. No.: 11/462,634

(22) Filed: Aug. 4, 2006

(65) Prior Publication Data

US 2007/0023831 A1 Feb. 1, 2007

Related U.S. Application Data

(60) Continuation of application No. 10/864,098, filed on Jun. 9, 2004, now Pat. No. 7,202,526, which is a division of application No. 10/401,137, filed on Mar. 27, 2003, now Pat. No. 6,777,746.

(30) Foreign Application Priority Data

| Mar. 27, 2002 | (JP) | ............................... 2002-088821 |
| Mar. 20, 2003 | (JP) | ............................... 2003-078462 |

(51) Int. Cl.
*H01L 29/76* (2006.01)
(52) U.S. Cl. ...................... 257/339; 257/343
(58) Field of Classification Search ................ 257/335, 257/339, 343, 347
See application file for complete search history.

(56) References Cited

U.S. PATENT DOCUMENTS

| 3,631,310 A | 12/1971 | Das ............................. 257/335 |
| 6,023,090 A | 2/2000 | Letavic et al. ................ 257/347 |
| 6,049,109 A | 4/2000 | Omura et al. ................ 257/347 |
| 6,627,948 B1 | 9/2003 | Fujihara ....................... 257/343 |
| 6,777,746 B2 | 8/2004 | Kitagawa et al. ............. 257/335 |
| 7,202,526 B2 * | 4/2007 | Kitagawa et al. ............. 257/335 |
| 2001/0050394 A1 | 12/2001 | Onishi et al. ................. 257/343 |

FOREIGN PATENT DOCUMENTS

JP 08-065127 3/1996

* cited by examiner

*Primary Examiner*—Mark Prenty
(74) *Attorney, Agent, or Firm*—Hogan & Hartson LLP

(57) ABSTRACT

The present invention provides a MOSFET having a low on-state resistance and a high withstand voltage as well as a small output capacitance (C(gd), etc.). The MOSFET has a p-type base layer 4 and a n-type source layer 5 selectively formed on the surface of the p-type base layer 4. A n-type drain layer 7 is formed in a position apart from the p-type base layer 4. On the surface of the region between the p-type base layer 4 and the n-type drain layer 7, a n-type drift semiconductor layer 12 and a p-type drift semiconductor layer 13 are alternately arranged from the p-type base layer 4 to the n-type drain layer 7. Further, in the region between the n-type source layer 5 and the n-type drain layer 7, a gate electrode 15 is formed via a gate insulating film 14. With the structure, the neighboring region of the gate electrode is depleted by a built in potential between the n-type drift semiconductor layer 12 and the p-type drift semiconductor layer 13 or by the potential of the gate electrode, when the gate electrode, source electrode, and drain electrode are at 0 potential.

18 Claims, 28 Drawing Sheets

FIELD EFFECT TRANSISTOR AND APPLICATION DEVICE THEREOF

CROSS-REFERENCE TO RELATED APPLICATIONS

This is a continuation of U.S. application Ser. No. 10/864,098, filed on Jun. 9, 2004, now U.S. Pat. No. 7,202,526, which is a divisional of application Ser. No. 10/401,137 filed Mar. 27, 2003, now U.S. Pat. No. 6,777,746, which applications are hereby incorporated by reference in their entireties. This application is based upon and claims the benefit of priority from the prior Japanese Patent Applications No. 2002-088821 filed on Mar. 27, 2002, and No. 2003-078462 filed on Mar. 20, 2003; the entire contents of which are incorporated herein by reference.

BACKGROUND OF THE INVENTION

The present invention relates to a field effect transistor and more particularly to a field effect transistor having low on-state resistance and small output capacitance and also to an application device thereof.

FIGS. 1 to 3 are drawings showing a structure of multi-resurf MOSFET which is a conventional horizontal field effect transistor (hereinafter, field effect transistor is abbreviated to MOSFET) having low on-state resistance or MOSFET called a super junction structure, and FIG. 1 is a perspective view thereof, wherein FIG. 2 is a plan view thereof, and FIG. 3a, FIG. 3b, and FIG. 3c are cross sectional views of the drawing shown in FIG. 2 which is cut respectively along the line segments A-A', B-B', and C-C'.

As shown in the drawings, on a surface of a p-type semiconductor substrate 201, a p-type base layer 204 is selectively formed, on the surface of which a high concentration n-type source layer 205 and a high concentration p-type contact layer 206 are selectively formed. Further, on the surface of the p-type semiconductor substrate 201, an n-type drain layer 209 is formed apart from the p-type base layer 204. On the n-type source layer 205 and the p-type contact layer 206, a source electrode 210 is formed and on the n-type drain layer 209, a drain electrode 211 is formed. On the bottom of the p-type semiconductor substrate 201, a substrate electrode 212 is mounted, which is biased by a same potential as of a source electrode 210.

An n-type semiconductor layer 202 and a p-type semiconductor layer 203 in a stripe shape are alternately arranged between the p-type base layer 204 and the n-type drain layer 209, as a drift layer. Namely, the n-type semiconductor layer 202 and the p-type semiconductor layer 203 are alternately arranged along a direction from the p-type base layer 204 toward the n-type drain layer 209, to which the stripe shape layers extend nearly perpendicular. Further, a gate electrode 208 is formed via a gate oxide film 207 on a surface of the p-type base layer 204 between the n-type source layer 205 or the n-type semiconductor layer 202 and the p-type semiconductor layer 203.

The type of MOSFET as described above is characterized in that the n-type semiconductor layer 202 and the p-type semiconductor layer 203 are formed in a stripe shape and alternately arranged (the multi-resurf structure, super junction structure) as a drift layer. Therefore, it is also characterized in that the drift layer is apt to be depleted, and a dose concentration of the drift layer can be increased. Thus the on-state resistance can be reduced.

However, in the configuration of the aforementioned conventional low on-state resistance MOSFET, electrons flow in the n-type semiconductor layer 202 of the drift layer but do not flow in the p-type semiconductor layer 203. Thus there is a defect that even if the reduced ratio of the effective sectional area of the n-type semiconductor layer 202 is compensated by increasing the concentration of the n-type semiconductor layer 202 in the super junction structure and by lowering the resistance, a sufficient effect cannot be expected for realizing the low on-state resistance of the whole element.

It has been also known that the MOSFET having the multi-resurf structure (super junction structure) is applied to a vertical MOSFET instead of the lateral MOSFET described above. However, even by use of such a structure, the same defect is caused as described above with respect to the horizontal type element, in a design of an element having a withstand voltage of several hundreds volt or less. Thus, enough advantages of applying the conventional multi-resurf structure or super junction structure cannot be expected for an improvement in the characteristic of the MOSFET of a comparatively low withstand voltage.

Therefore, the present invention was made with the foregoing in view and it is an object of the present invention to provide a field effect transistor capable of realizing a low on-state resistance and low output capacitance and to provide its application device even in a design of an element having a comparatively low withstand voltage (several tens volt to 100 V or so).

BRIEF SUMMARY OF THE INVENTION

According to an aspect of the present invention, a field effect transistor is provided having a base layer of a first conductivity type formed on a substrate surface, a source layer of a second conductivity type selectively formed on a surface of the base layer, a drain layer of the second conductivity type formed on the substrate apart from the base layer, a semiconductor layer which is formed in a region between the base and the drain layer and has a higher resistance than the base layer, and a gate electrode at least formed on the surface of the base layer via a gate insulating film.

According to another aspect of the present invention, a field effect transistor is provided having a base layer of a first conductivity type formed on a surface of a substrate, a source layer of a second conductivity type selectively formed on a surface of the base layer, a drain layer of the second conductivity type formed on the substrate apart from the base layer, a drift semiconductor layer of the first conductivity type extended from the base layer to the drain layer in a region between the base layer and the drain layer, a drift semiconductor layer of the second conductivity type formed together with the drift semiconductor layer of the first conductivity type, and a gate electrode formed on almost overall surfaces of the drift semiconductor layer of the first conductivity type and drift semiconductor layer of the second, conductivity type via a gate insulating film.

According to other aspect of the present invention, a field effect transistor is provided having a base layer of a first conductivity type formed on a surface of an insulating substrate, a source layer of a second conductivity type selectively formed in the base layer, a drain layer of the second conductivity type formed on the insulating substrate apart from the base layer, a drift layer formed in a region between the base layer and the drain layer, and a gate electrode formed on a surface of the base layer via a gate insulating film.

According to the other aspect of the present invention, a photo-relay is provided having a light emission element to which a switching control input signal is applied, a light electromotive force element for receiving light emitted from the light emission element and generating an output DC voltage, and at least two field effect transistors connected in series with each other having a source electrode and a gage electrode commonly connected, which is provided with an output voltage of the light electromotive force element is supplied, wherein the field effect transistors are composed of a field effect transistor defined in either one of Claims 1 to 24 and the output voltage of said light electromotive force element given to the gate electrode is equal to or higher than a withstand voltage applied between the source electrode and the drain electrode of the field effect transistors.

DETAILED DESCRIPTION OF THE INVENTION

The embodiments of the present invention will be explained hereunder with reference to the accompanying drawings.

FIRST EMBODIMENT

Figure 1:
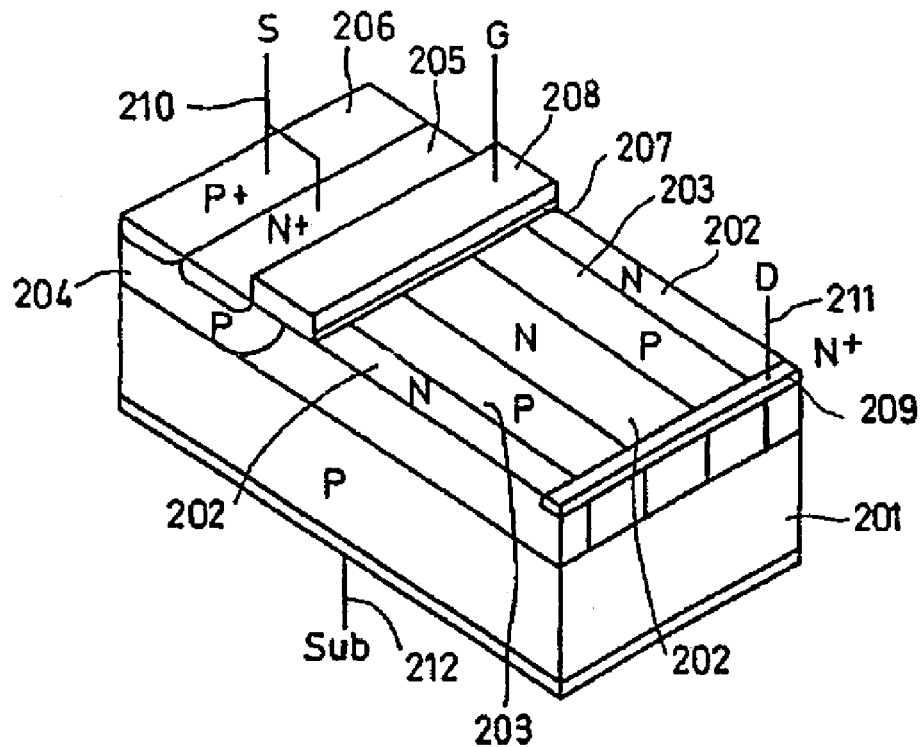
FIG. 1 is a perspective-view showing a structure of a conventional super junction MOSFET.
Figure 2:
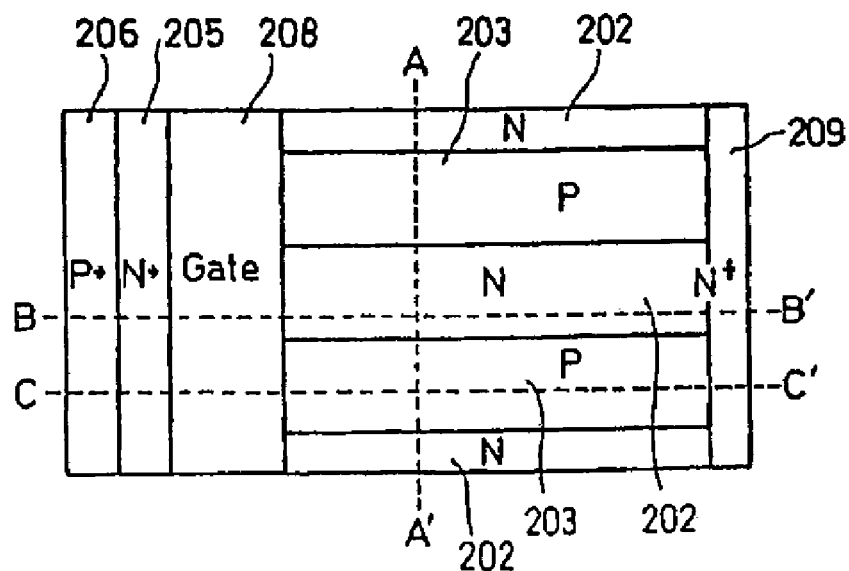
FIG. 2 is a plan view of the element shown in FIG. 1, FIG. 3a, FIG. 3b and FIG. 3c are cross sectional views showing sectional structures of the element along the line segments A-A', B-B', and C-C' shown in FIG. 2.
Figure 3A:
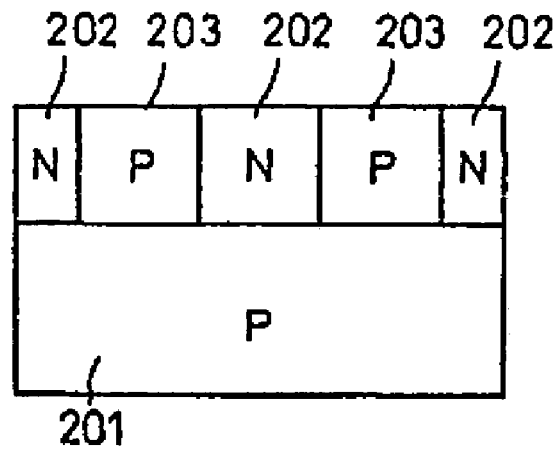
Figures 3B, 3C:
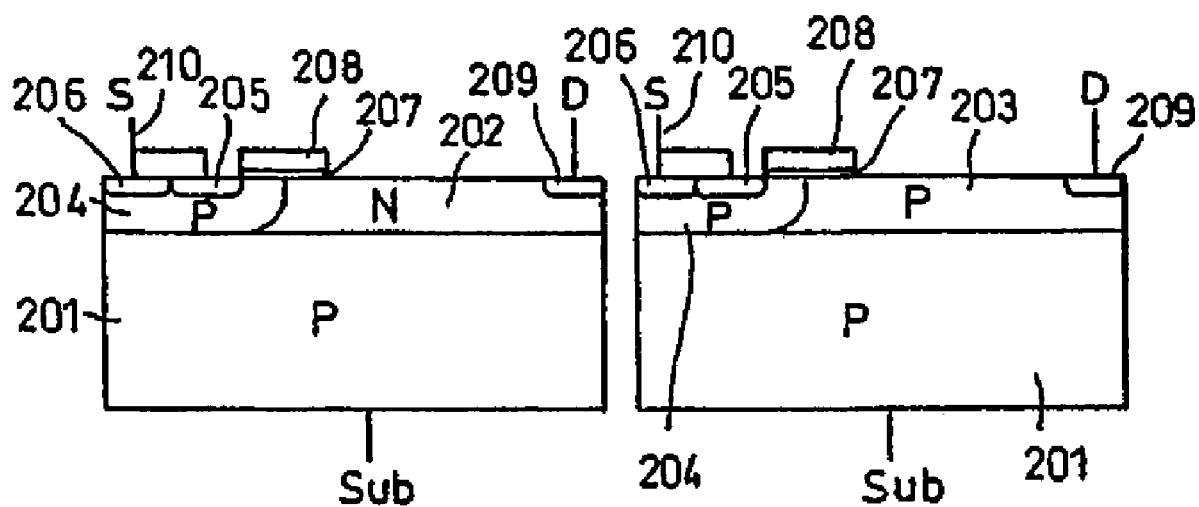
Figure 4:
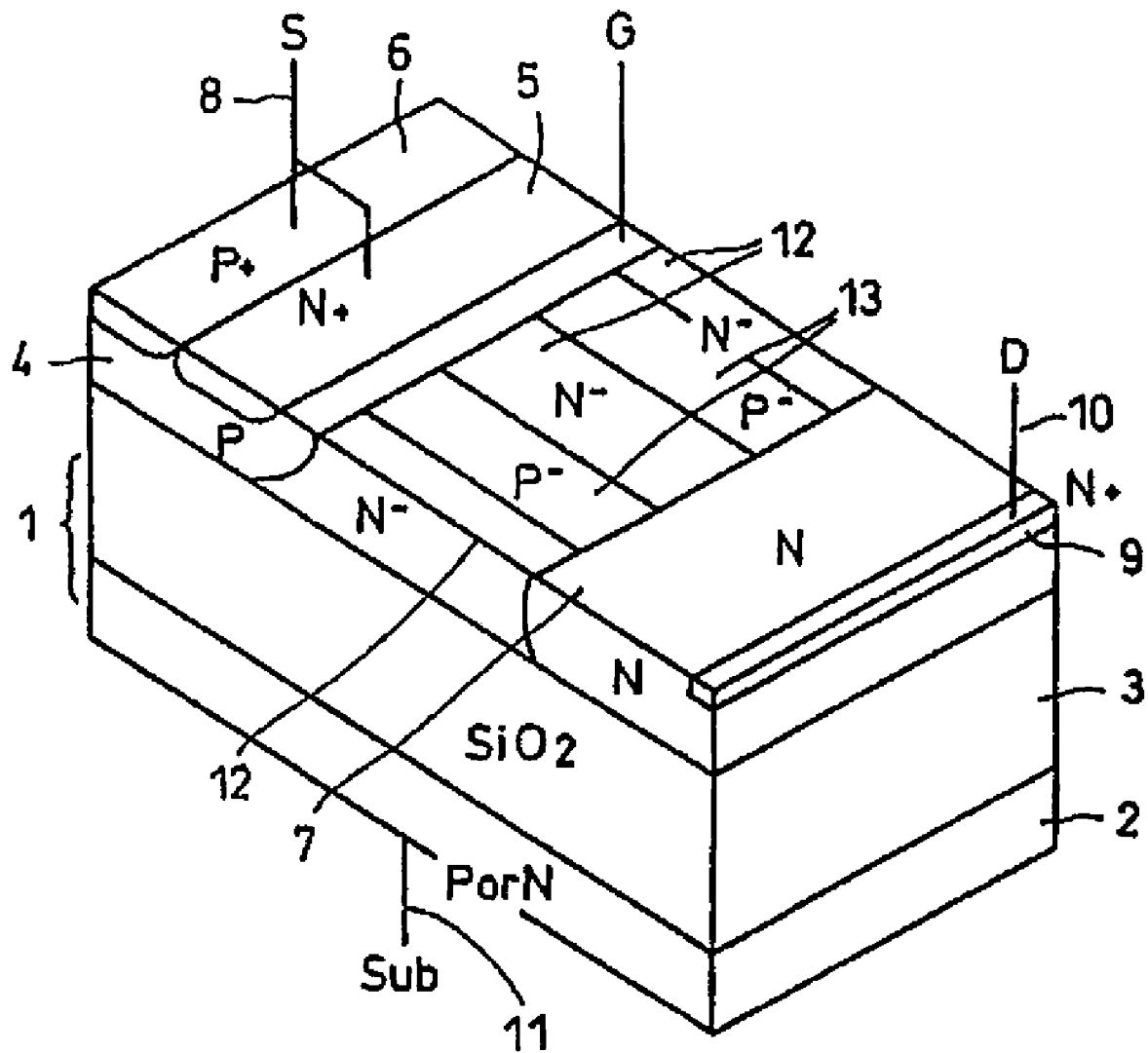
FIG. 4 is a perspective view showing the structure of the MOSFET partially removed according to a first embodiment of the present invention.
Figure 5:
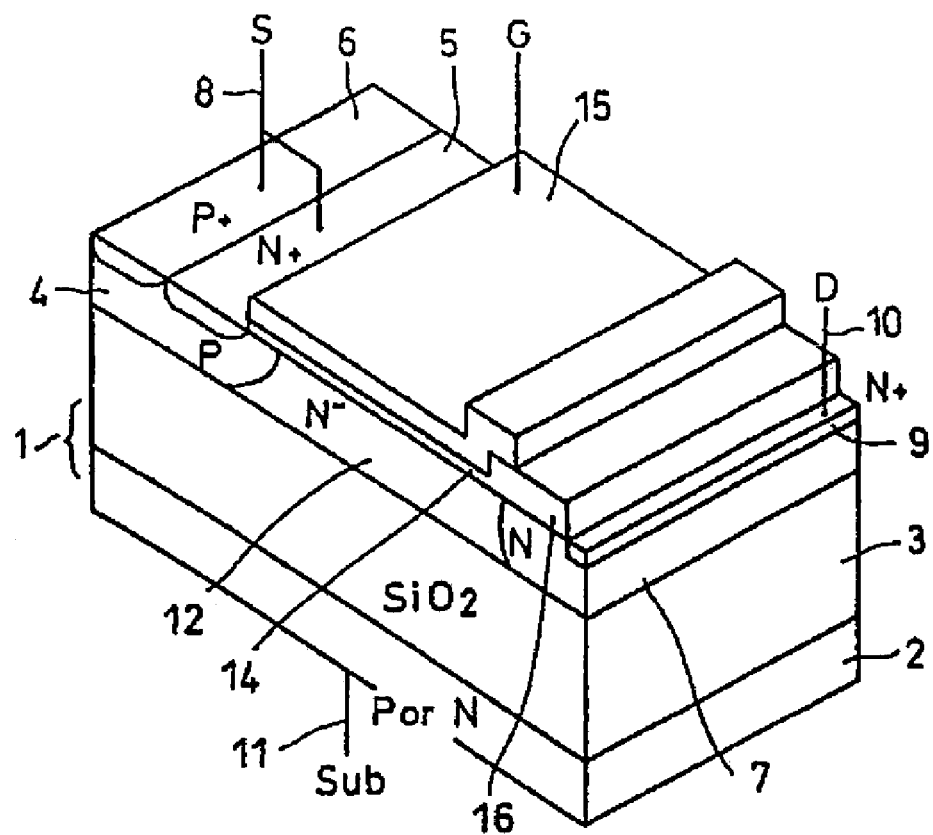
FIG. 5 is a perspective view showing the structure of the MOSFET according to the first embodiment of the present invention.
Figure 6:
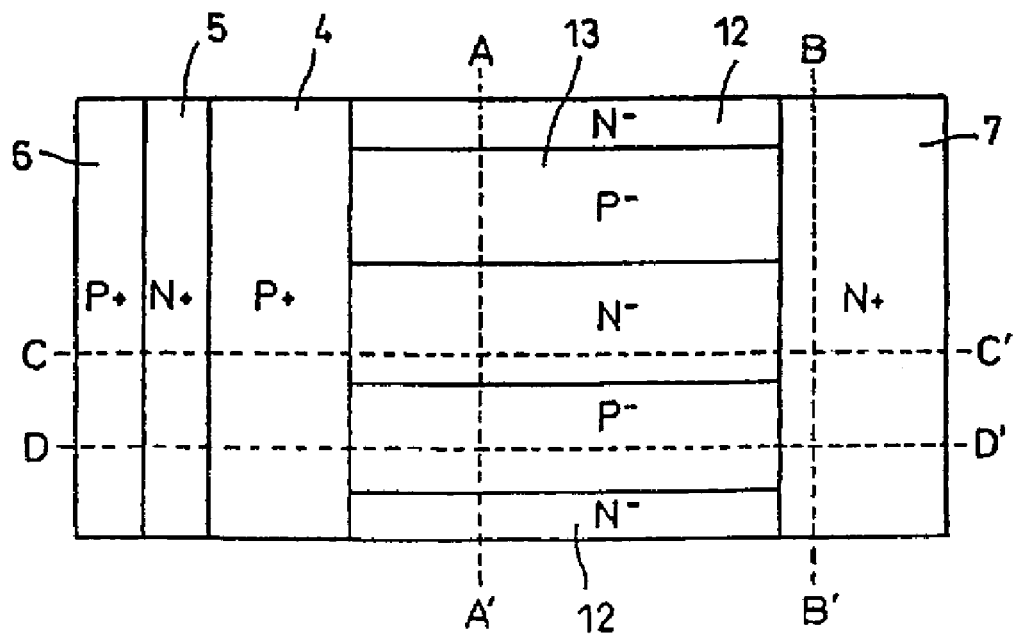
FIG. 6 is a plan view showing the structure of the MOSFET according to the first embodiment of the present invention.
Figures 7A, 7B:
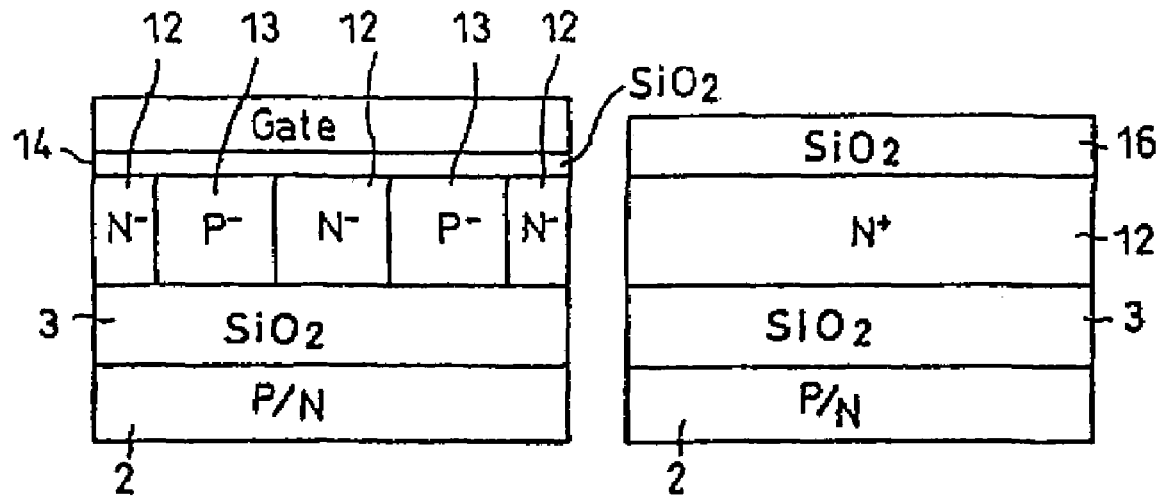
FIG. 7a, FIG. 7b, FIG. 7c and FIG. 7d are cross sectional views showing sectional structures of the element along lines A-A', B-B', C-C', and D-D' shown in FIG. 6.
Figures 7C, 7D:
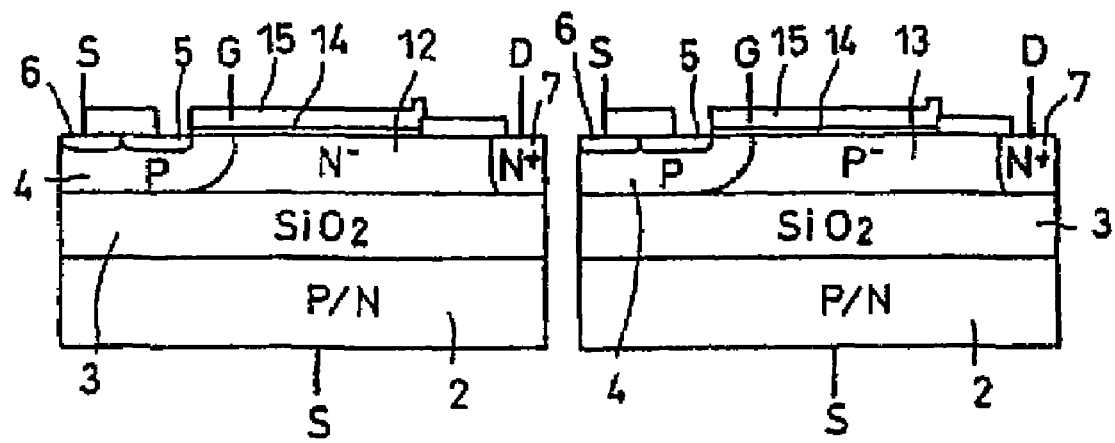
Figure 8:
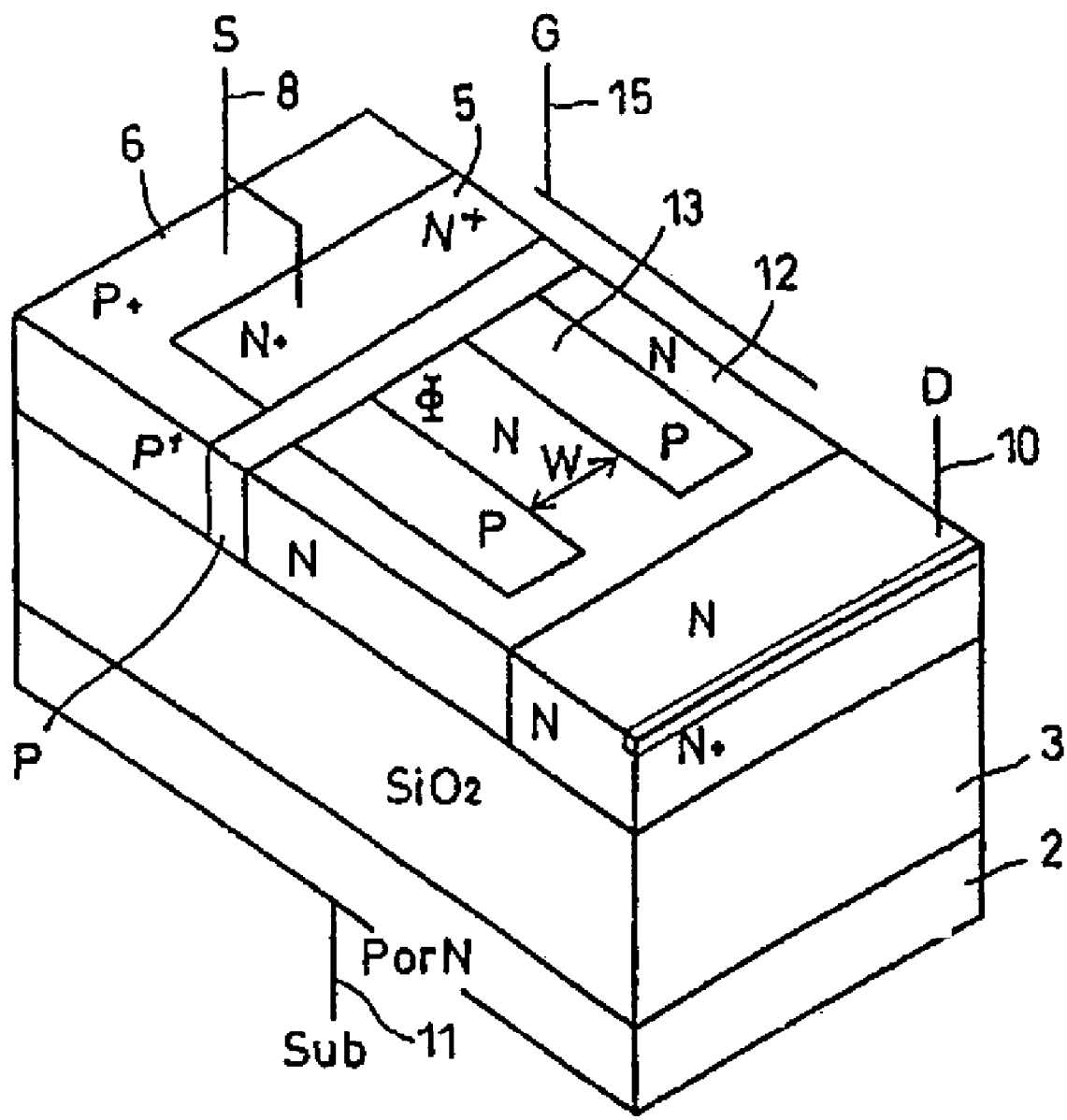
FIG. 8 is a perspective view showing a modified example of the lateral MOSFET according to the first-embodiment of the present invention.

FIGS. 4 to 7 are drawings showing a structure of a horizontal field effect transistor (hereinafter, field effect transistor is abbreviated to MOSFET) which is a first embodiment of the present invention. FIGS. 4 and 5 are perspective views thereof and FIG. 6 is a plan view thereof, and FIG. 7a, FIG. 7b, FIG. 7c and FIG. 7d are cross sectional views showing the element which is respectively cut along lines A-A', B-B', C-C', and D-D' shown in FIG. 3. FIG. 4 is a perspective view showing the element shown in FIG. 5, which is partially removed. This lateral MOSFET is a MOSFET of a type, which is called multi-resurf MOSFET or super junction MOSFET.

As shown in the drawings, a substrate 1 is composed of a p-type (or n-type) silicon semiconductor 2 and an embedded oxide film 3 laminated on a surface thereof. On a top of the embedded oxide film 3, a p-type base layer 4 is selectively formed. On a surface of the p-type base layer 4, a high concentration n-type source layer 5 and a high concentration p-type contact layer 6 are selectively formed. Further, on a surface of the embedded oxide film 3 of the semiconductor substrate 1, an n-type drain layer 7 is formed apart from the p-type base layer 4. On the n-type source layer 5 and the p-type contact layer 6, a source electrode 8 is formed. On the n-type drain layer 7, a drain electrode 10 is formed via a contact layer 9. On a bottom of the p-type semiconductor substrate 1, a substrate electrode 11 is mounted, which is provided with a same potential as that of the source electrode 8.

Between the p-type base layer 4 and the n-type drain layer 7, an n-type drift semiconductor layer 12 and a p-type drift semiconductor layer 13, both in a stripe shape, are formed along a direction connecting there between. The. n-type drift semiconductor layer 12 and the p-type drift semiconductor layer 13 are alternately formed between the p-type base layer 4 and the n-type drain layer 7, each of which is extended nearly perpendicular to a line connecting the p-type base layer 4 and the n-type drain layer 7. The repetitive pitch of the layer 12 and layer 13 is within a range from 0.01 μm to 5 μm.

Further, as shown in FIG. 5, a gate electrode 15 is formed via a gate oxide film 14 on the surface of the active layer composed of the n-type source layer 4, the n-type drift semiconductor layer 12, the p-type drift semiconductor layer 13, and the n-type drain layer 7. The gate oxide film 14 is formed on the surfaces of the n-type drift semiconductor layer 12, the p-type drift semiconductor layer 13 and the n-type drain layer 7, a thickness of which is increased on the surface of the n-type drain layer 7, as shown by 16. The gate electrode 15 covers the stepped portion.

One of the characteristics of the lateral MOSFET according to the embodiment is that the n-type drift semiconductor layer 12 and the p-type drift semiconductor layer 13 are formed at a portion, which is in contact with the gate oxide film, that the gate oxide film covers all over the drift semiconductor layer 12 and 13 or that the gate oxide film covers apart of the drain layer 7 in addition to all over the drift semiconductor layer 12 and 13. Another characteristic is that the n-type drift semiconductor layer 12 and the p-type drift semiconductor layer 13 are designed so as to improve the extension of a depletion layer in the off state. At the same time, they are designed so as to reduce the capacitance between the gate and the drain in the heat equilibrium state when the gate voltage is 0 V.

For example, when the thickness of the embedded oxide film 3 is selected as 3 μm and the thickness of the active layer formed on the oxide film is selected as less than 1 μm (for example, 0.1 μm), an element with a high withstand voltage can be realized while both low output capacitance and low on-state resistance are maintained. Here, the active layer is composed of the p-type base layer 4, the n-type drain layer 7, the n-type drift semiconductor layer 12 and p-type drift semiconductor layer 13, the latter two layers being formed between the base layer 4 and drain layer 7. Further, when the gate oxide film on the drain side is designed to have a thickness of 2 to 10 times as thick as on the other side, an element with a higher withstands voltage can be realized.

The characteristic of the lateral MOSFET of the present embodiment is that the n-type drift semiconductor layer 12 and p-type drift semiconductor layer 13 in a stripe shape are alternately arranged as a drift layer, so that the neighborhood of the gate is apt to be depleted and the extension of the depletion layer in at the gate portion can be optimized. Therefore, a high withstand voltage of the element and low capacitance between the gate and the drain layer can be realized.

FIGS. 8 to 14 are perspective views and side cross sectional views showing a modified example of the lateral MOSFET according to the present invention shown in FIGS. 4 to 7. In the drawings, the same parts as those of the lateral MOSFET shown in FIGS. 4 to 7 are assigned with the same numerals, and the corresponding explanation is omitted but only the different parts will be explained hereunder. In the lateral MOSFET shown in FIG. 8, the n-type source layer 5 and the high concentration p-type contact layer 6 are directly formed on the embedded oxide film 3 instead in the p-type base layer 4. Further, the n-type drift semiconductor layer 12 and the p-type drift semiconductor layer 13 are respectively formed in a comb shape.

Assuming an impurity dose of the drift semiconductor layer of the first conductivity type or the drift semiconductor layer of the second conductivity type as Φ and a stripe width as W, a following relation is held between the values:

$$\Phi \times W \leq 1 \times 10^8 (\mathrm{cm}^{-1})$$

A dose of the drift semiconductor layer of the second conductivity type is preferably within a range front $1.0 \times 10^{11}$ to $6.0 \times 10^{13}$ cm$^{-2}$.

Figure 9:
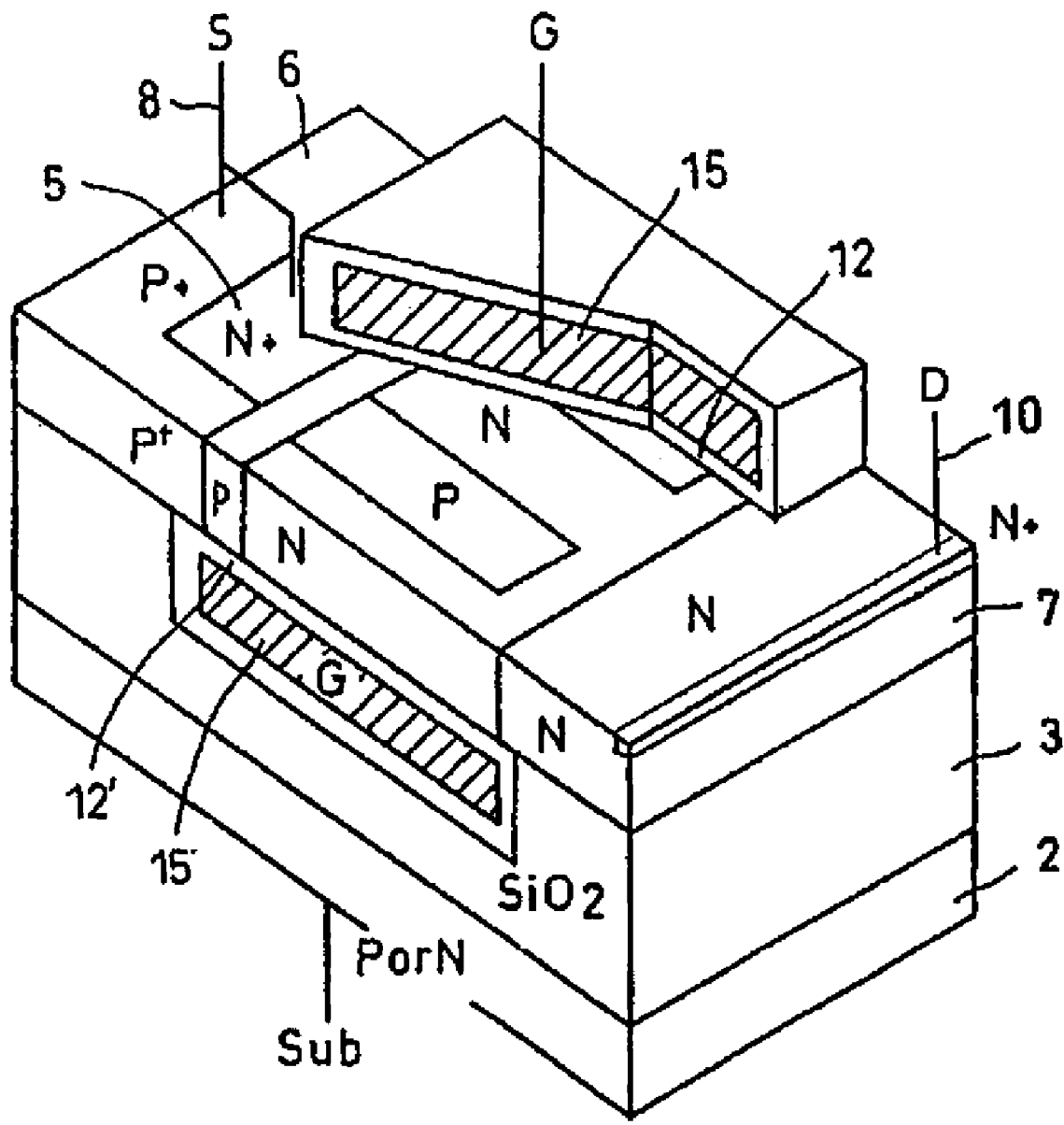
FIG. 9 is a perspective view showing another modified example of the lateral MOSFET according to the first embodiment of the present invention.

In the lateral MOSFET shown in FIG. 9, the structures of the n-type source layer 5, the high concentration p-type contact layer 6, the n-type drift semiconductor layer 12, and the p-type drift semiconductor layer 13 are the same as those of the lateral MOSFET shown in FIG. 5. However, it is different from it in that the gate electrodes 15 and 15' are provided above and under the n-type drift semiconductor layer 12 and the p-type drift semiconductor layer 13.

Figure 10:
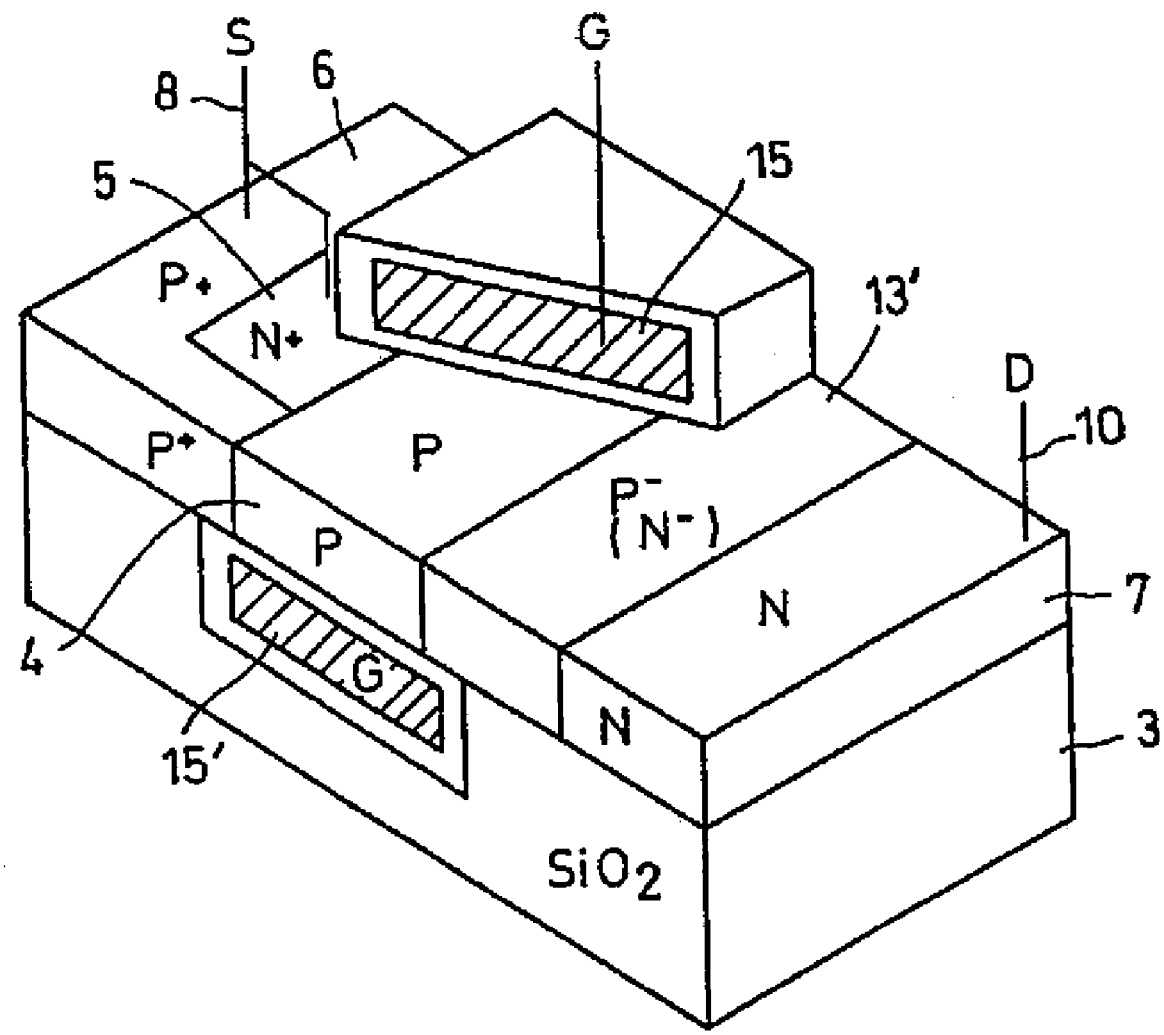
FIG. 10 is a perspective view showing a modified example of the lateral MOSFET shown in FIG. 9.

FIG. 10 is a perspective view showing a modified example of the lateral MOSFET shown in FIG. 9. The difference from the lateral MOSFET shown in FIG. 9 is that the gate electrodes 15 and 15' are provided above and under the p-type base layer 4, which form an offset against the n-type drain layer 7 and that a high resistance drift semiconductor layer is provided between the p-type base layer 4 and the n-type drain layer 7. The high resistance drift semiconductor layer may be of p-type, n-type or SJ-type.

Figure 11:
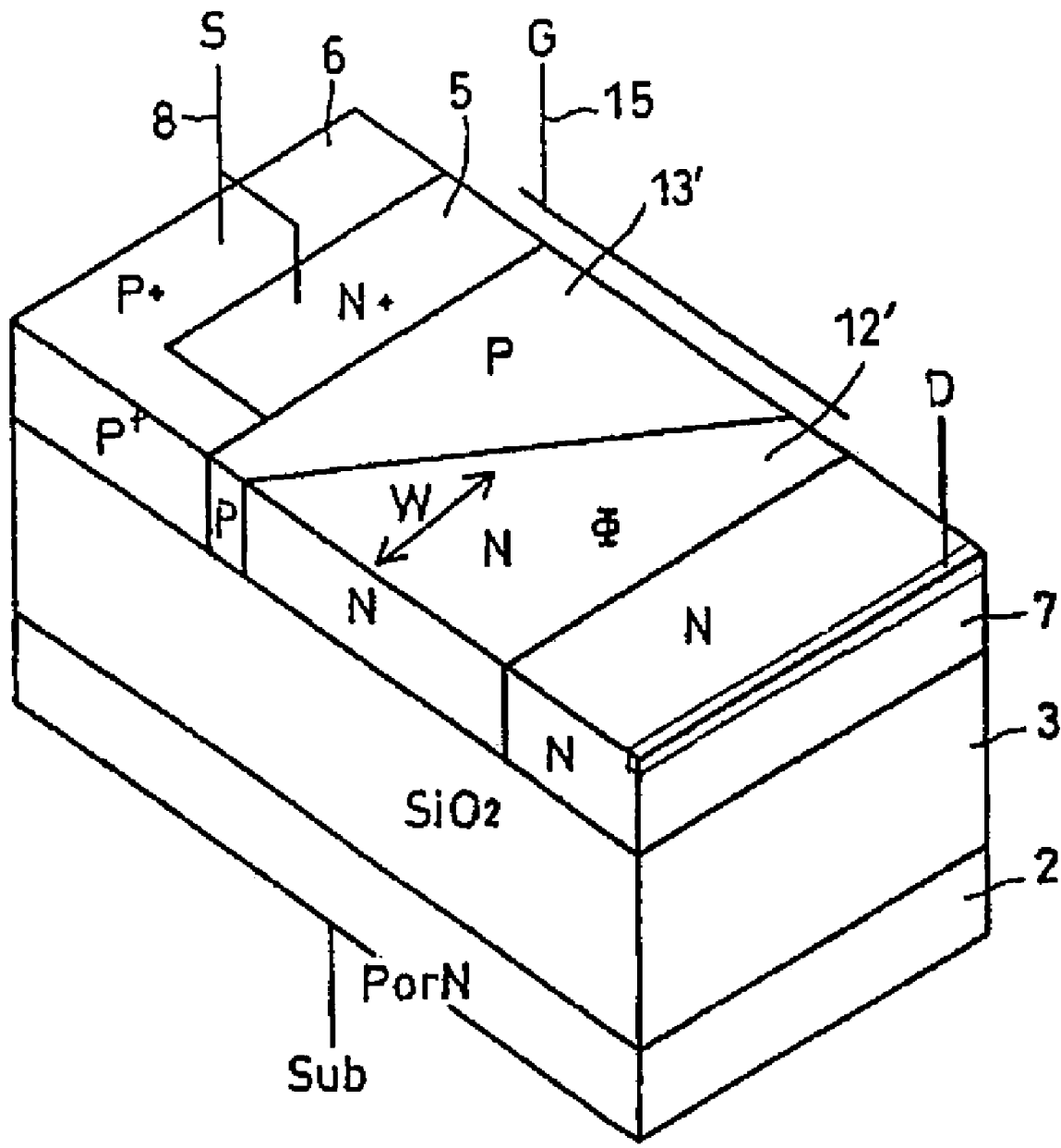
FIG. 11 is a perspective view showing yet other modified example of the lateral MOSFET according to the first embodiment of the present invention.

In the lateral MOSFET shown in FIG. 11, the n-type drift semiconductor layer 12 and the p-type drift semiconductor layer 13 are in a trapezoidal shape instead of a stripe shape. Therefore, the impurity, concentration of the p-type drift semiconductor layer is selected so as to be substantially higher on the source side than on the drain side. Further, the impurity concentration of the n-type drift semiconductor layer is selected so as to be substantially higher on the drain side than on the source side.

Figure 12:
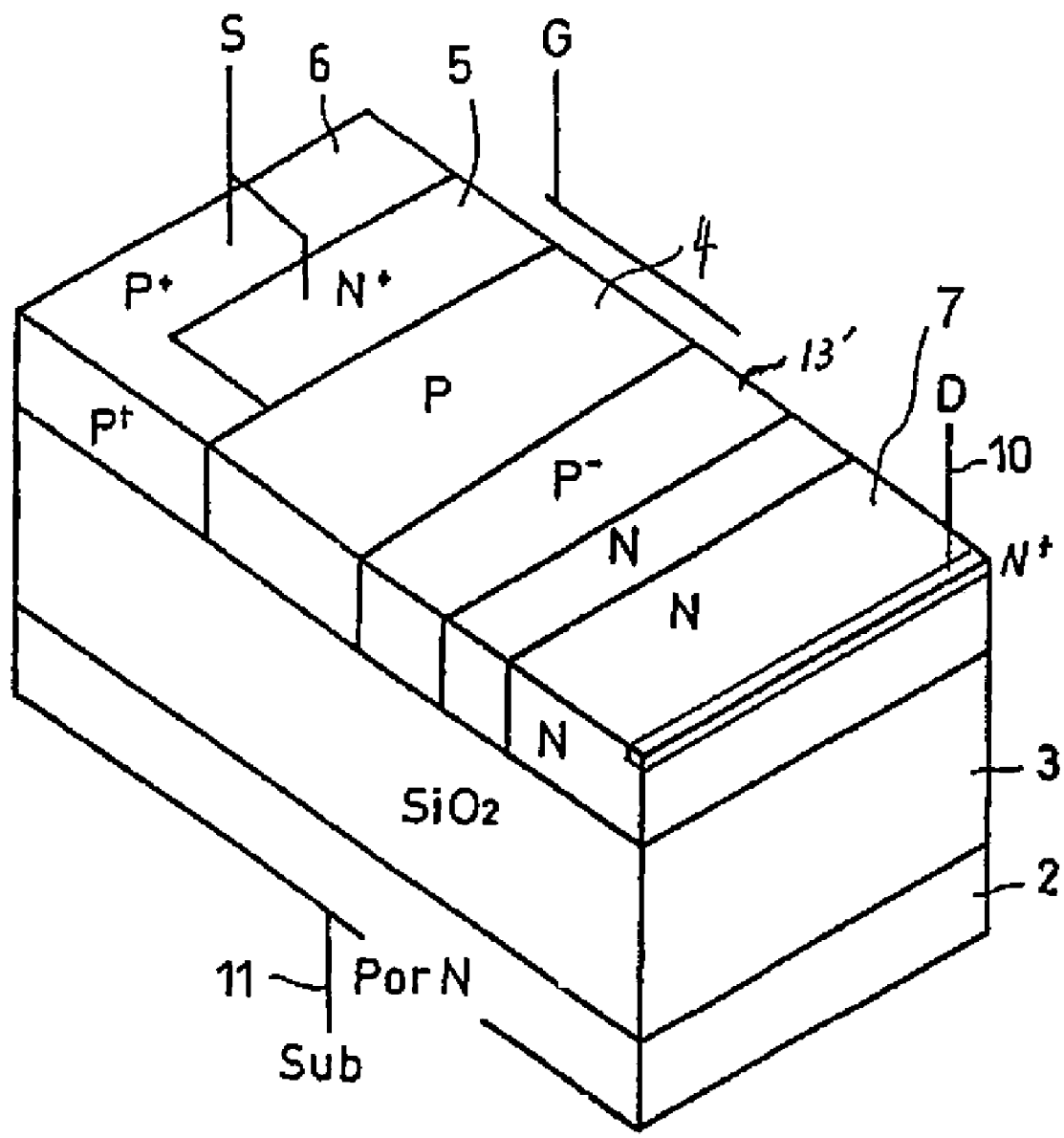
FIG. 12 is a perspective view showing yet other modified example of the lateral MOSFET according to the first embodiment of the present invention.

In the lateral MOSFET shown in FIG. 12, a P/P$^-$/N junction is formed in place of the super junction structure composed of the n-type drift semiconductor layer 12 and the p-type drift semiconductor layer 13 as shown in FIG. 4.

Figure 13:
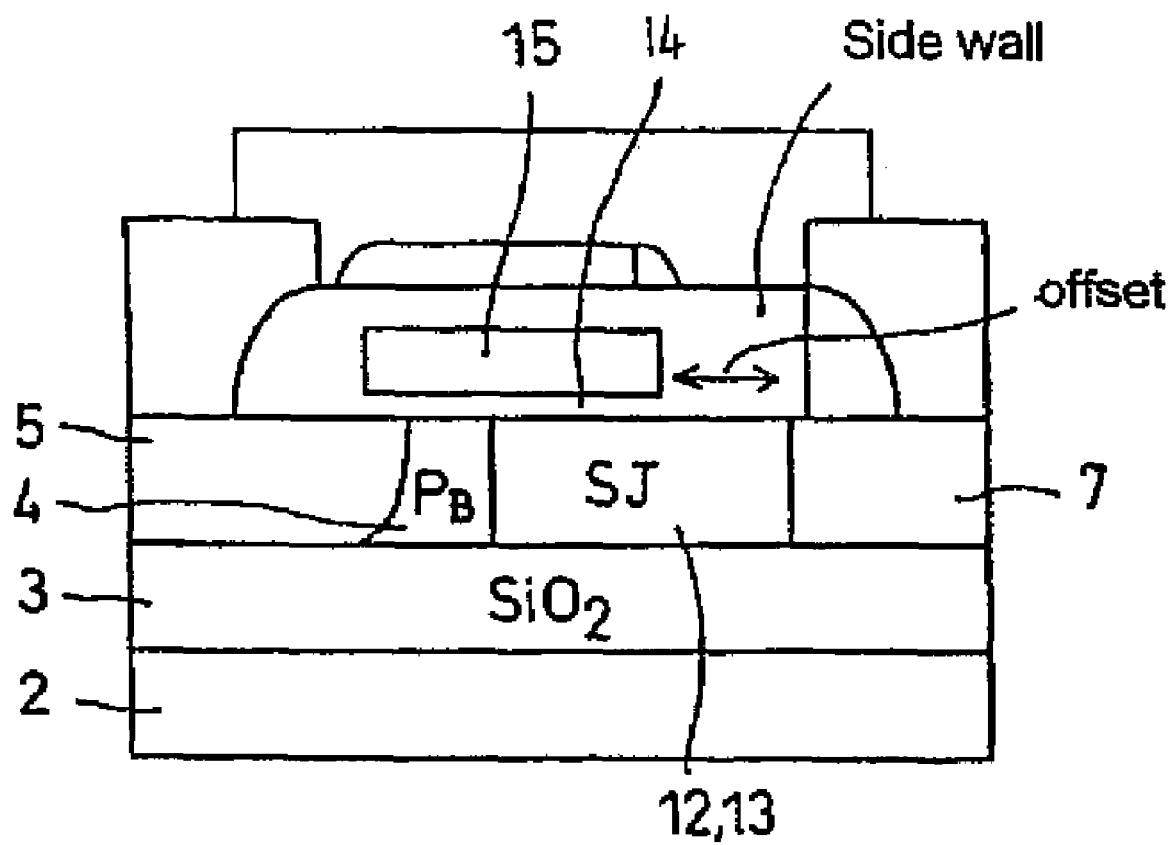
FIG. 13 is a cross sectional view showing a chip structure of the lateral MOSFET according to the first embodiment of the present invention.

FIG. 13 is a cross sectional view showing a chip structure of the lateral MOSFET. In the drawing, the thickness of the embedded oxide film 3 is about 3 μm and the thickness of the super junction layer composed of the n-type drift semiconductor layer 12 and the p-type drift semiconductor layer 13 formed thereon or the high resistance p-type semiconductor layer 4 is about 0.1 μm. On the super junction layer, the gate electrode 15 is formed on the oxide film 14 with a thickness of about 0.1 μm. A high withstand voltage and low output capacitance can be realized at the same time by forming the gate oxide film. with a thickness almost equal to or larger than the thickness of the SOI layer.

Figure 14:
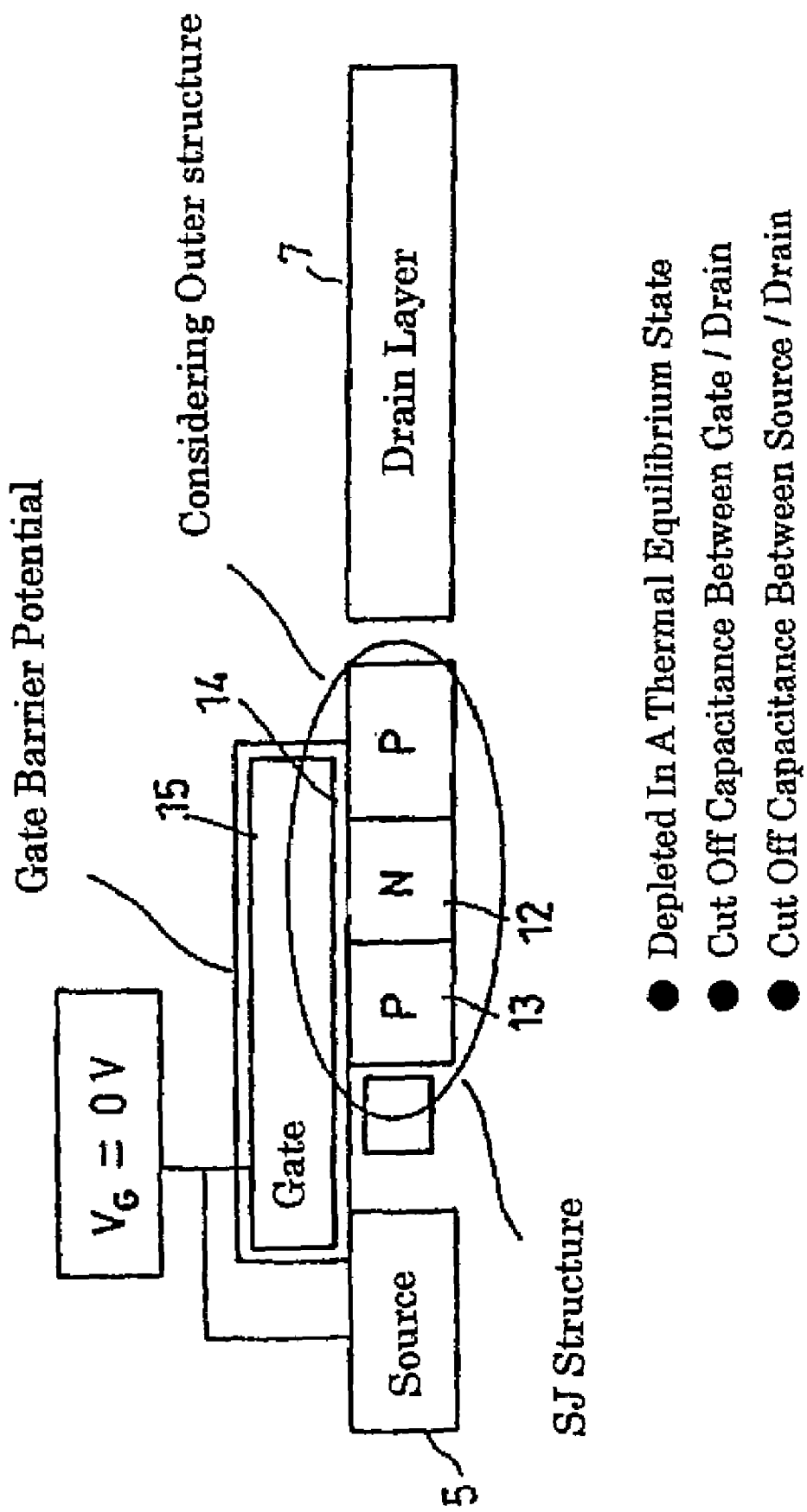
FIG. 14 is a drawing conceptually showing the structure of the lateral MOSFET according to the first embodiment of the present invention.

FIG. 14 is a drawing conceptually showing the structure of the lateral MOSFET of the present invention explained above.

SECOND EMBODIMENT

Figure 15:
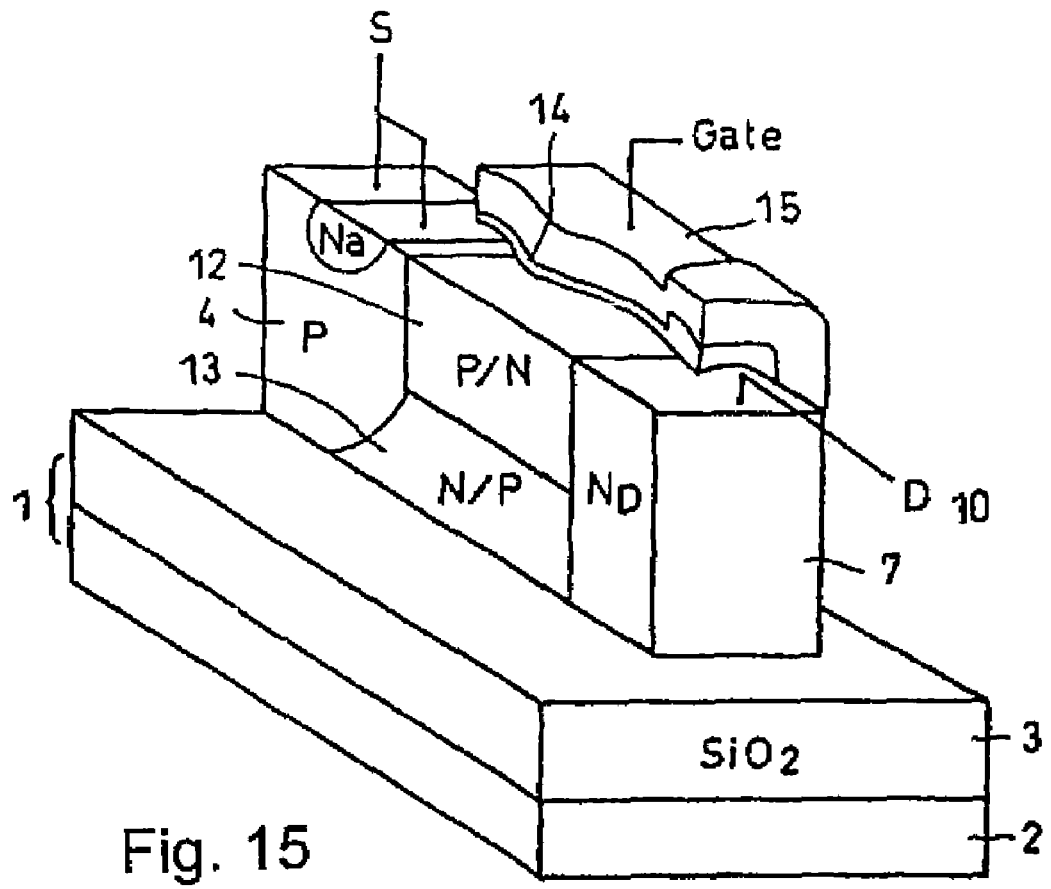
FIG. 15 is a perspective view showing a structure of the MOSFET according to the second embodiment of the present invention.
Figure 16:
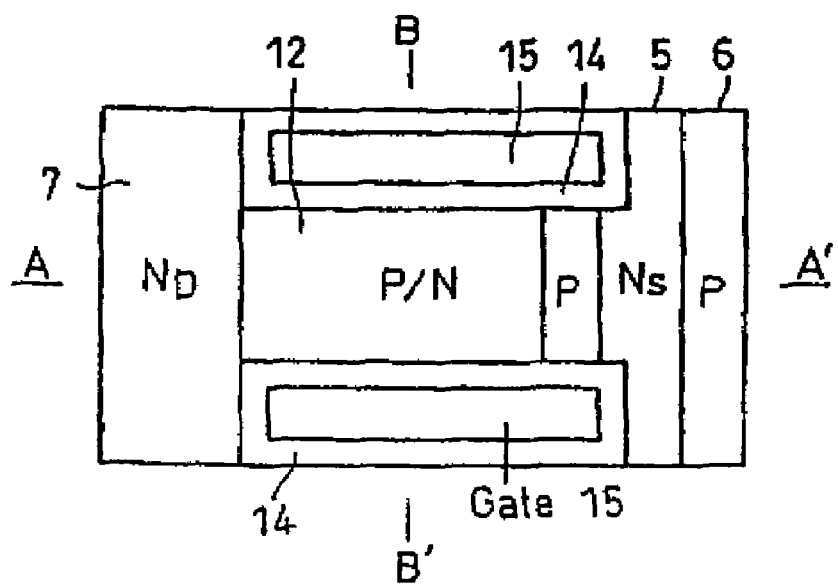
FIG. 16 is a plan view showing the structure of the MOSFET according to the second embodiment of the present invention.
Figure 17:
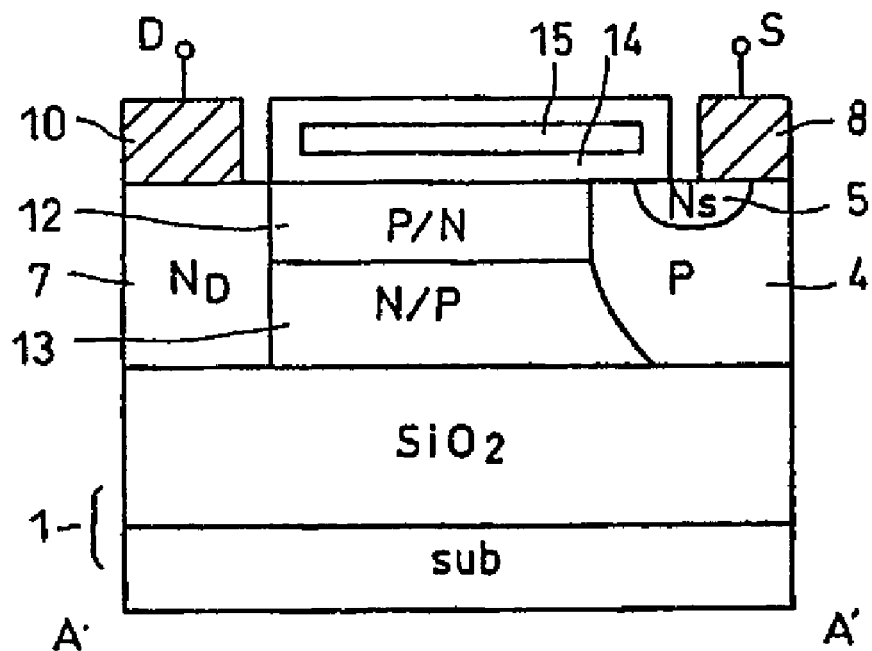
FIG. 17 is a cross sectional view showing a sectional structure of the element along a line A-A' shown in FIG. 16.
Figure 18:
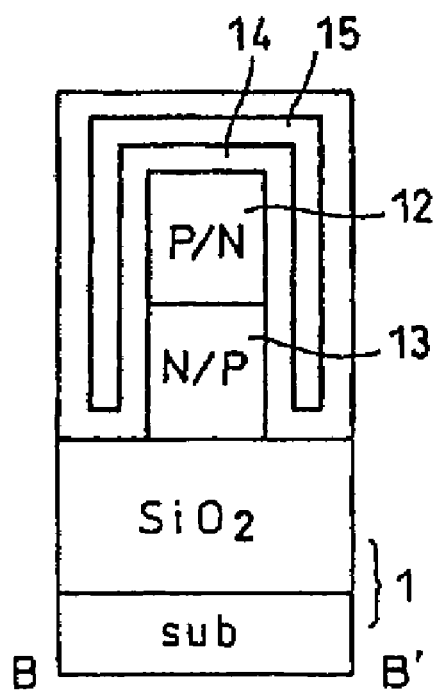
FIG. 18 is a cross sectional view showing a sectional structure of the element along a line B-B' shown in FIG. 16.

FIGS. 15 to 18 are drawings showing a structure of the lateral MOSFET which is the second embodiment of the present invention. FIG. 15 is a perspective view thereof, and FIG. 16 is a plan view thereof, and FIGS. 17 and 18 are cross sectional views of the element which is cut respectively along lines A-A' and B-B' shown in FIG. 16.

In the embodiment, the active layer composed of the p-type base layer 4, the n-type drain layer 7, the n-type drift semiconductor layer 12 and p-type drift semiconductor layer 13 is formed in a pillar shape on the SOI insulating substrate 1, in which the latter two layers being formed between the p-type base layer 4 and the n-type drain layer 7. It has such a structure that the gate electrode 15 holds both sides of the pillar-shaped active layer. In the active layer held by the gate electrode 15, the n-type drift semiconductor layer 12 and p-type drift semiconductor layer 13 of the super junction structure are alternately laminated. In the drawings, the same parts as those shown in FIGS. 4 to 6 are assigned with the same numerals and detailed explanation will be omitted.

Figure 19:
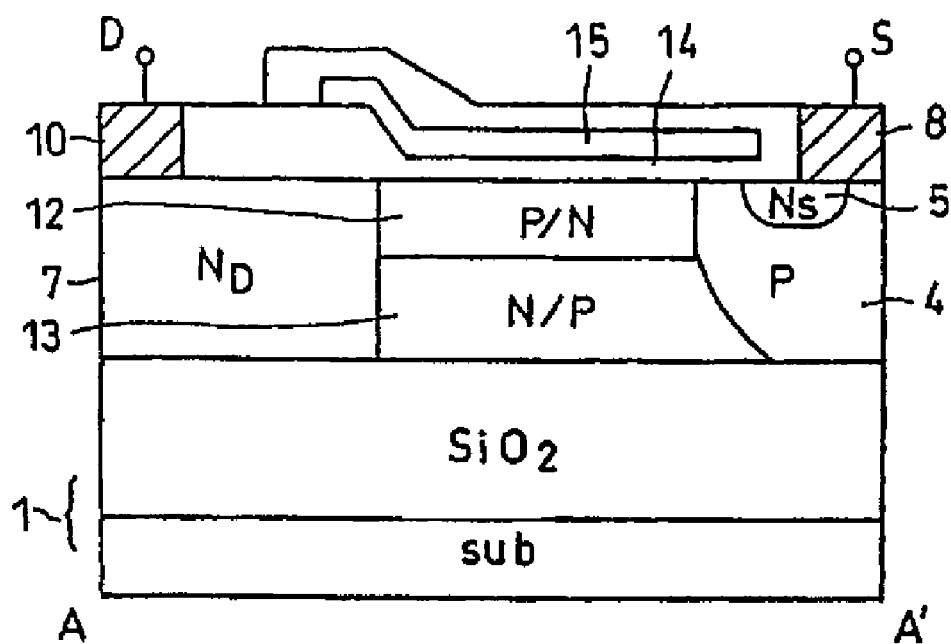
FIG. 19 is a cross sectional view of the MOSFET showing a modified example according to the second embodiment of the present invention.

Further, FIG. 19 is a cross sectional view showing a modified example of the second embodiment mentioned above. The cross sectional view corresponds to FIG. 17. The gate oxide film 14 of the vertical MOSFET shown in FIG. 17 has a constant film thickness between the source electrode 8 and the drain electrode 10. However, it is different in that the gate oxide film 14 of the vertical MOSFET shown in FIG. 19 is thick in the neighborhood of the drain electrode 10, in the same way as with the case shown in FIG. 5. In the drawing, the same parts as those shown in FIG. 17 are assigned with the same numerals and detailed explanation will be omitted.

THIRD EMBODIMENT

FIGS. 20 to 23 are perspective views showing a structure of a vertical trench gate MOSFET according to the third embodiment of the present invention.

Figure 20:
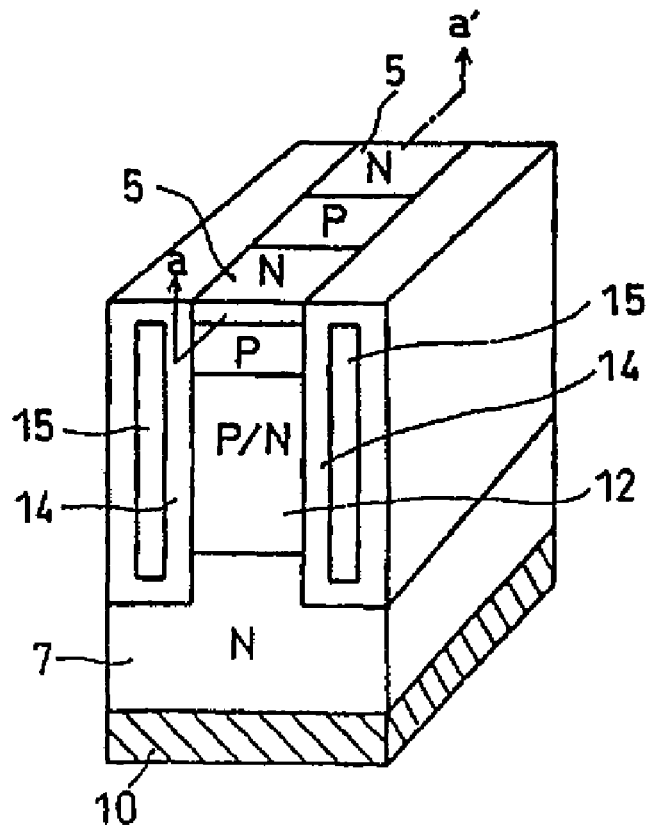
FIG. 20 is a perspective view showing the structure of an element according to the third embodiment of the present invention.
Figure 21:
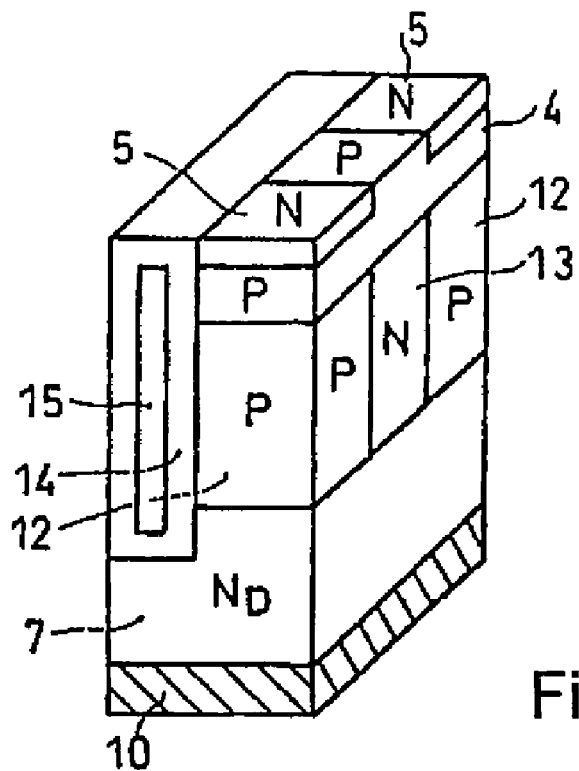
FIG. 21 is a cross sectional and perspective view of the MOSFET showing a modified example according the third embodiment of the present invention.

FIG. 21 is a perspective view showing a half of the vertical MOSFET shown in FIG. 20, which is cut vertically into halves. As the drawings show, in this embodiment, it is different from the lateral MOSFET shown in FIG. 14 in that the gate electrode has a trench structure and the n-type drift semiconductor layer 12 and the p-type drift semiconductor layer 13 are extended in a vertical direction and arranged in a horizontal direction.

Figure 22:
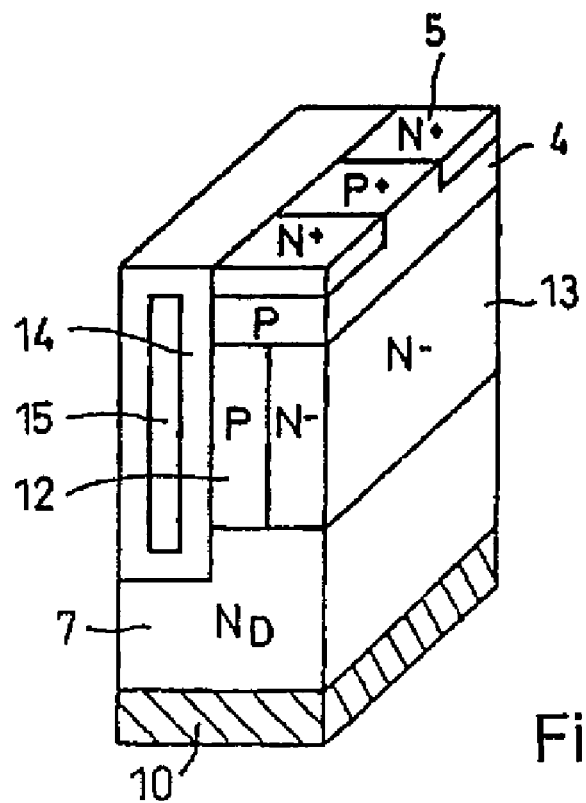
FIG. 22 is a cross sectional and perspective view of the MOSFET showing another modified example according to the third embodiment of the present invention.

Further, FIG. 22 shows a modified example of FIG. 21. As shown in the drawing, the n-type drift semiconductor layer 12 and the p-type drift semiconductor layer 13 are vertically extended. However, it is different from the vertical MOSFET shown in FIG. 21 in that the drift semiconductor layer 12 and 13 are alternately laminated in a direction from one of the two gate electrodes 15 and 15' to the other.

Figure 23:
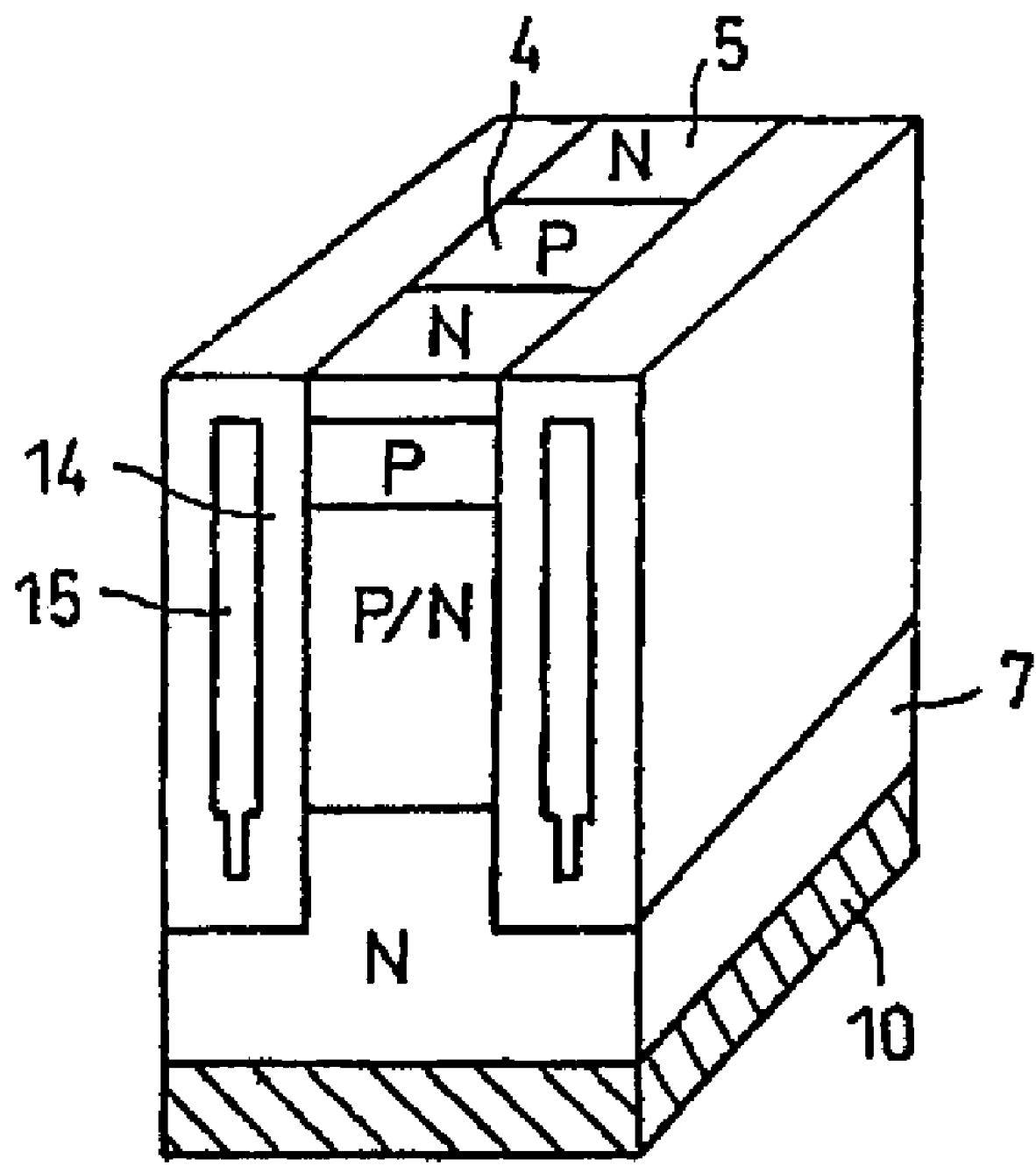
FIG. 23 is a perspective view of the MOSFET showing still another modified example according to the third embodiment of the present invention.

Furthermore, the vertical MOSFET shown in FIG. 23 is a modified example of the vertical trench gate MOSFET shown in FIG. 20, in which a part of the gate oxide film 14 has a large thickness in the same way as shown in FIG. 15.

In the drawings, the same parts as those shown in FIGS. 15 to 18 are assigned with the same numerals and detailed explanation will be omitted.

FIGS. 24 to 28 show a modified example of the vertical MOSFET shown in FIGS. 20 to 23.

Figure 24:
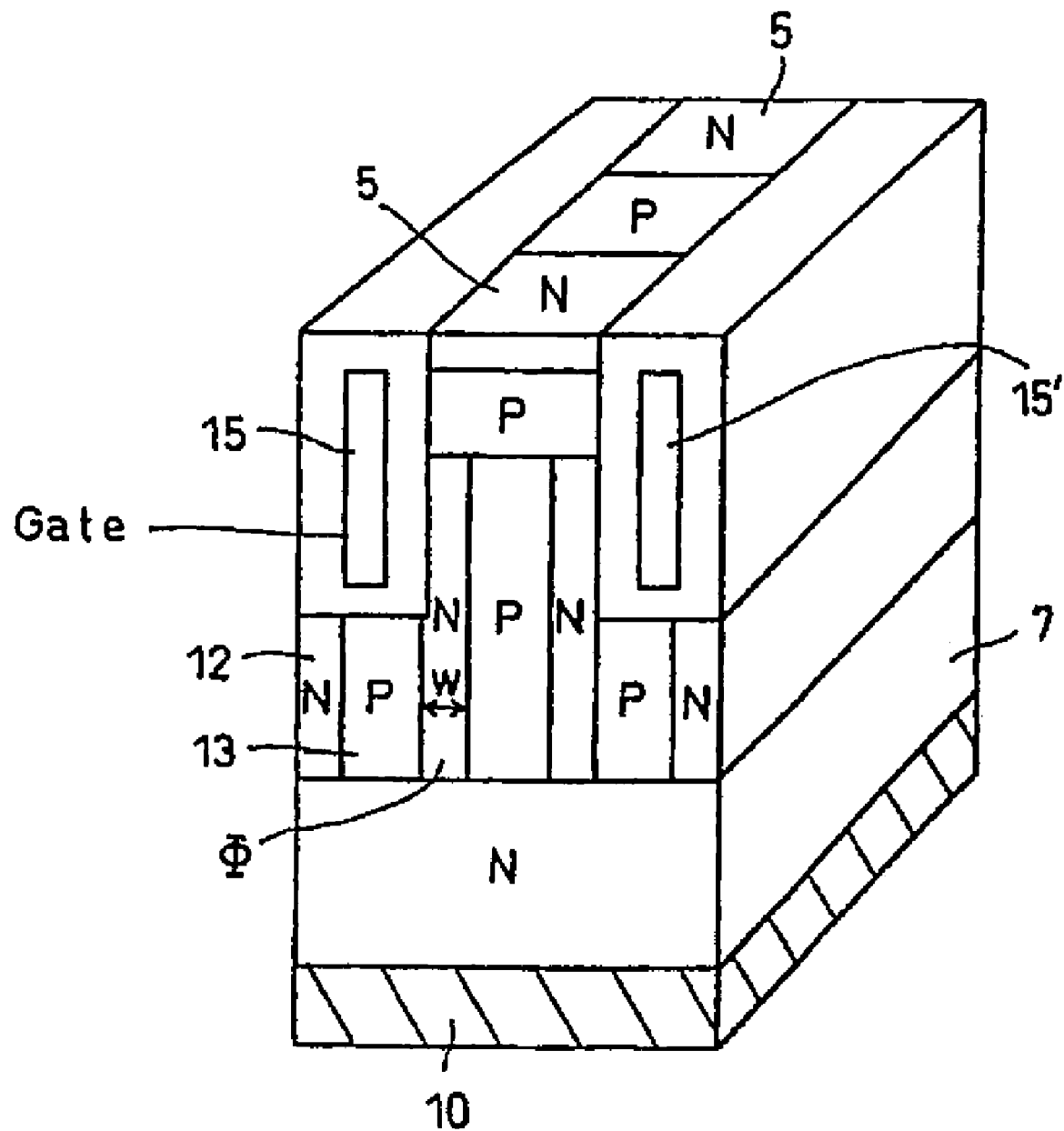
FIG. 24 is a perspective view of the MOSFET showing a further modified example according to the third embodiment of the present invention.

In the vertical trench gate MOSFET shown in FIG. 24, as compared with the FET shown in FIG. 22, the n-type drift semiconductor layer 12 and the p-type drift semiconductor layer 13 have larger width than the width of the two gate electrodes 15 and 15' and thus the layers 12 and 13 are extended downward out of the region between the two gate electrodes 15 and 15'. Applying the structure, the capacitance between the electrodes can be reduced.

Figure 25:
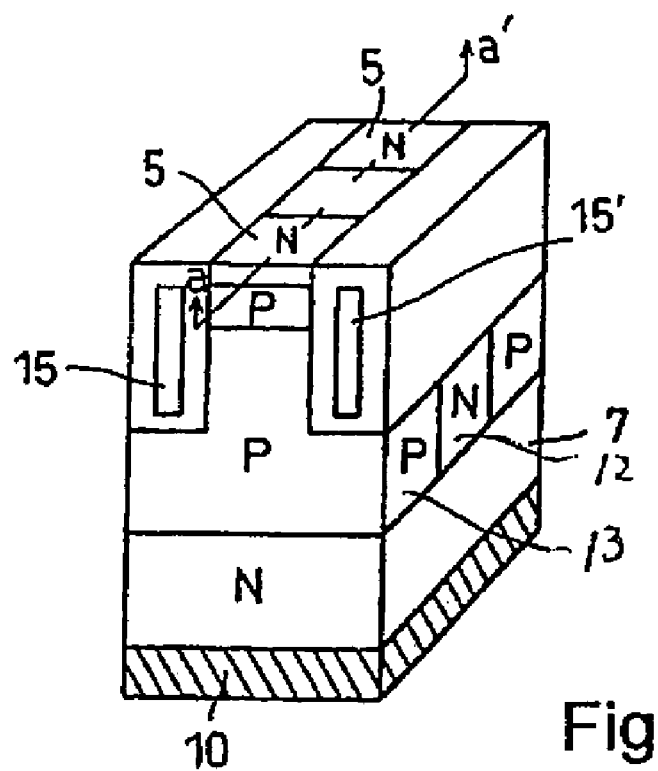
FIG. 25 is a perspective view of the MOSFET showing a still further modified example according to the third embodiment of the present invention.
Figure 26:
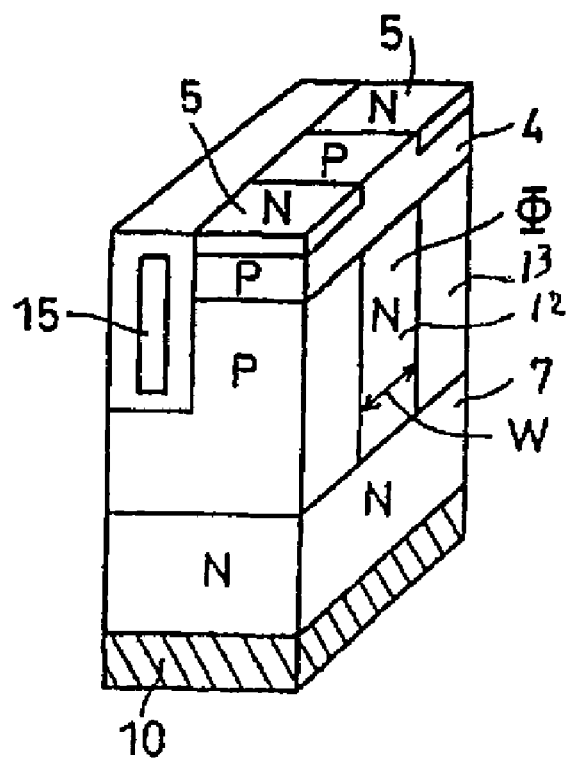
FIG. 26 is a perspective view of the MOSFET showing yet a further modified example according to the third embodiment of the present invention.

In a vertical trench gate MOSFET shown in FIG. 25, as shown in FIG. 26, showing a perspective view of a half of the MOSFET vertically cut into halves, the n-type drift semiconductor layer 12 and the p-type drift semiconductor layer 13 are extended vertically. However, it is different from the vertical trench gate MOSFET shown in FIG. 24 in that they are alternately laminated and arranged in along a longitudinal direction of the two gate electrodes 15 and 15'. Further, in this structure, the n-type drift semiconductor layer 12 and the p-type drift semiconductor layer 13 are laminated so that the longitudinal directions thereof intersect the longitudinal directions of the trench gate electrodes 15 and 15' orthogonally. However, the orthogonal direction is not always necessary and an optional angle, for example, 60 degrees may be acceptable. With the structure, as the FET shown in FIG. 24, the precise positioning in manufacturing of the trench gate electrode is not necessary, so that the manufacturing is simplified.

Figure 27:
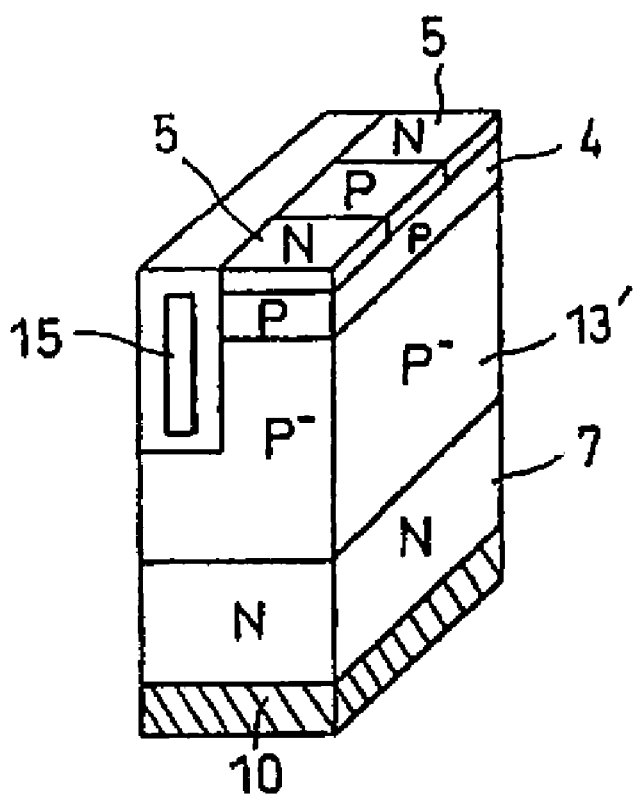
FIG. 27 is a perspective view of the MOSFET showing yet a further modified example according to the third embodiment of the present invention.

FIG. 27 is a perspective view showing a half of the vertical trench gate MOSFET that is cut vertically into halves, in the same way as with FIG. 26. This structure does not adopt the super junction structure but the p-type high resistance semiconductor layer 13' extends beyond the region of the trench gate in the depth direction and extends deeply downward.

Figure 28:
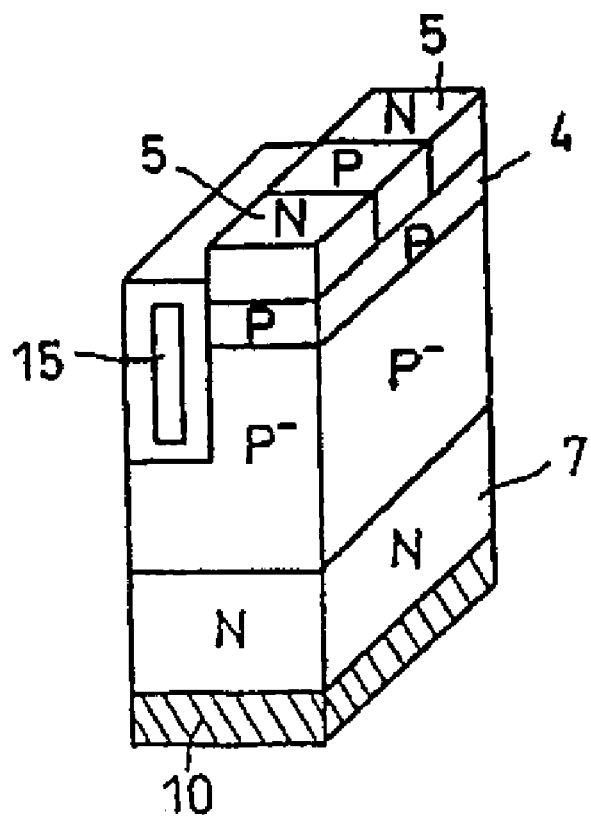
FIG. 28 is a perspective view of the MOSFET showing yet a further modified example according to the third embodiment of the present invention.

FIG. 28 is a perspective view showing a half of the vertical trench gate MOSFET that is cut vertically into halves, in the same way as with FIG. 27. In this structure, it is different from the FET shown in FIG. 25 in that the top end of the trench gate 15 in the depth direction is lower than the n-type source region 4. With the structure, the capacitance between the source and gate electrodes can be reduced and the contact property of the source electrode can be improved.

FOURTH EMBODIMENT

FIGS. 29 to 36 are drawings for showing the fourth embodiment according to the present invention. The lateral MOSFET according to the fourth embodiment of the present invention, as shown in the plan view of FIG. 29, includes two lateral MOSFETs 21 and 22 mutually connected in series and are formed in a same substrate. The MOSFETs 21 and 22 are symmetrical with respect to the central line B-B', so that the corresponding parts are indicated with corresponding numbers with a prime ' attached. Almost in the center of the surface of the semiconductor substrate 2, drain electrode pads 10 and 10' composed of a square or circle aluminum pad are formed on both sides of the center line B-B'. On the upper part of the surface of the semiconductor substrate 2, source electrode pads 8 and 8' also composed of an almost square or circle aluminum pad are formed on both sides of the center line B-B'. Between the source electrodes 8 and 8', a gate electrode 23 also composed of an almost square or circle aluminum pad is formed.

Figure 29:
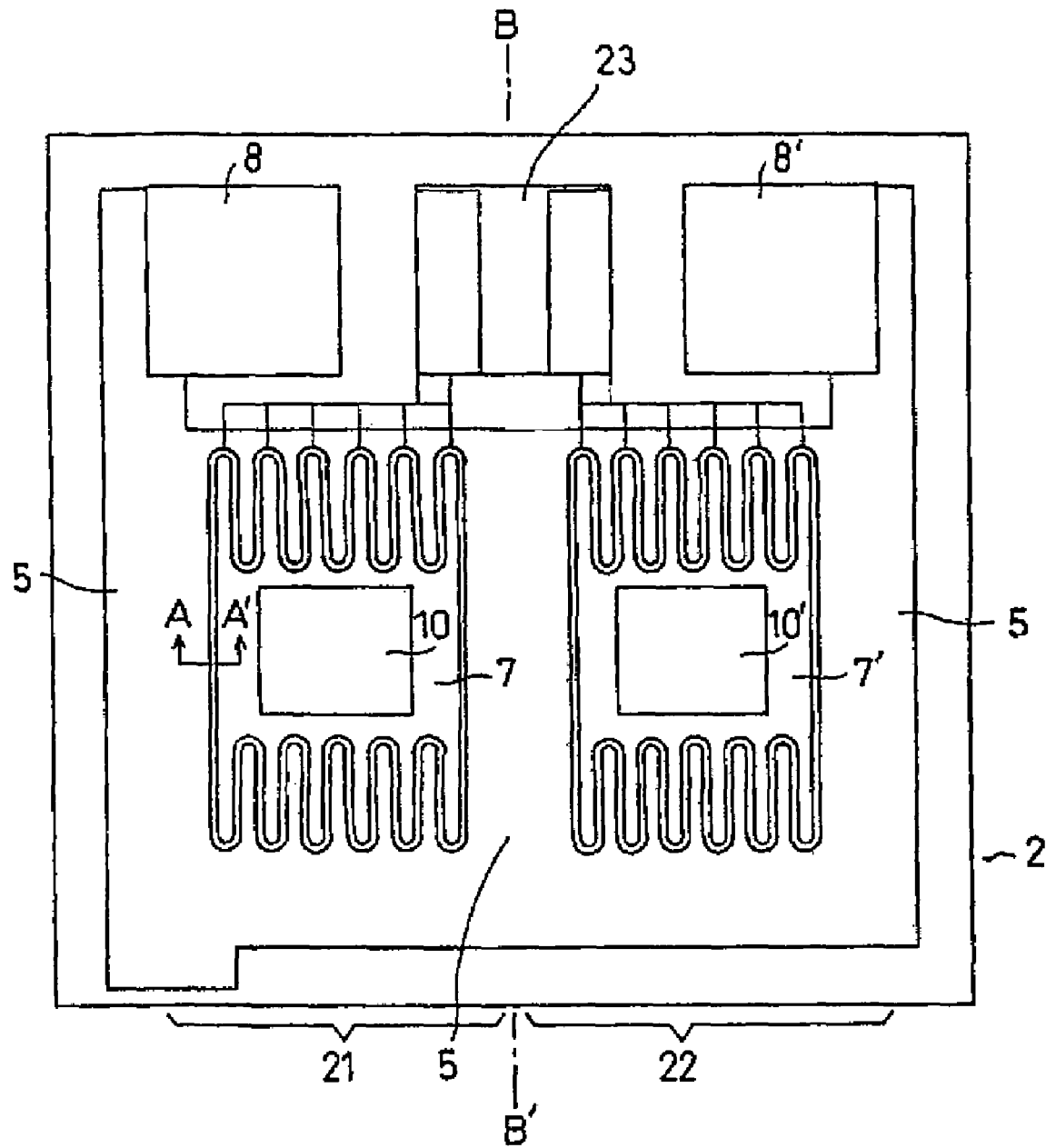
FIG. 29 is a plan view of the lateral MOSFET according to the fourth embodiment of the present invention.
Figure 30:
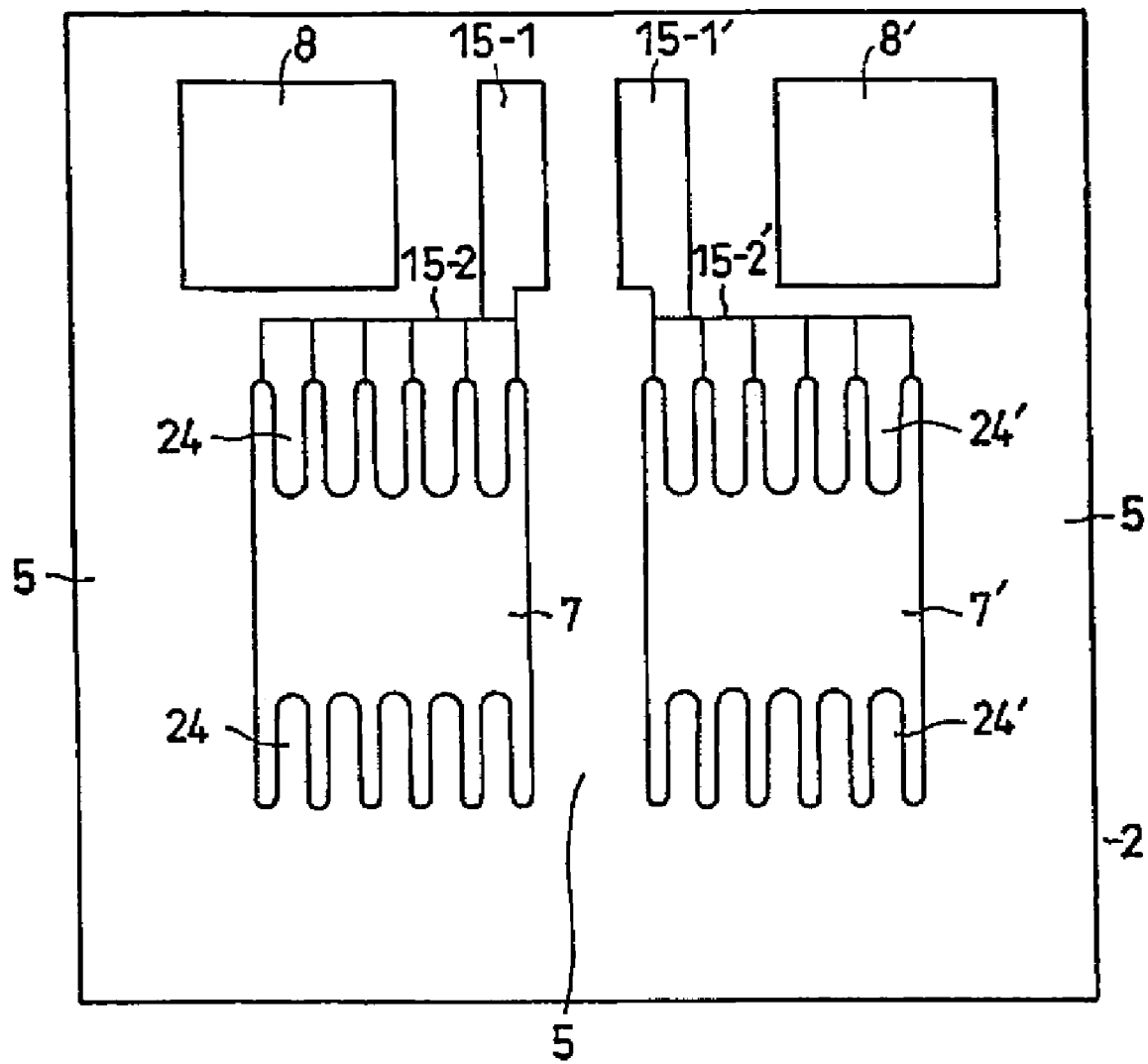
FIG. 30 is a plan view showing a structure of a surface region of the semiconductor substrate constituting the lateral MOSFET shown in FIG. 29.

FIG. 30 is a plan view showing a configuration of the surface region of the semiconductor substrate 2 including the lateral MOSFET shown in FIG. 29. In the surface region of the semiconductor substrate 2, drain regions 7 and 7' are formed in the almost rectangular region including the drain electrodes 10 and 10' shown in FIG. 29. Around the drain regions 7 and 7', a source region 5 is formed. The source region 5 is not formed in the part of the gate electrode 15 on the semiconductor substrate 2 shown in FIG. 29. On the surface of the semiconductor substrate 2 on which the gage electrode pad 23 is formed, polysilicon gate electrode pads 15-1 and 15-1' are formed. The poly silicon gate electrode pads 15-1 and 15-1' are separated from each other, for example, by inserting a P++ high concentration impurity layer or an insulating layer between them. The reason that the polysilicon gate electrode pads 15-1 and 15-1' are separated from each other is to prevent the two lateral MOSFET s 21 and 22, as shown in the plan view of FIG. 29, from being electrically conducted while no bias voltage is applied to the gate electrode 23. The reason will be additionally described later.

Figure 31:
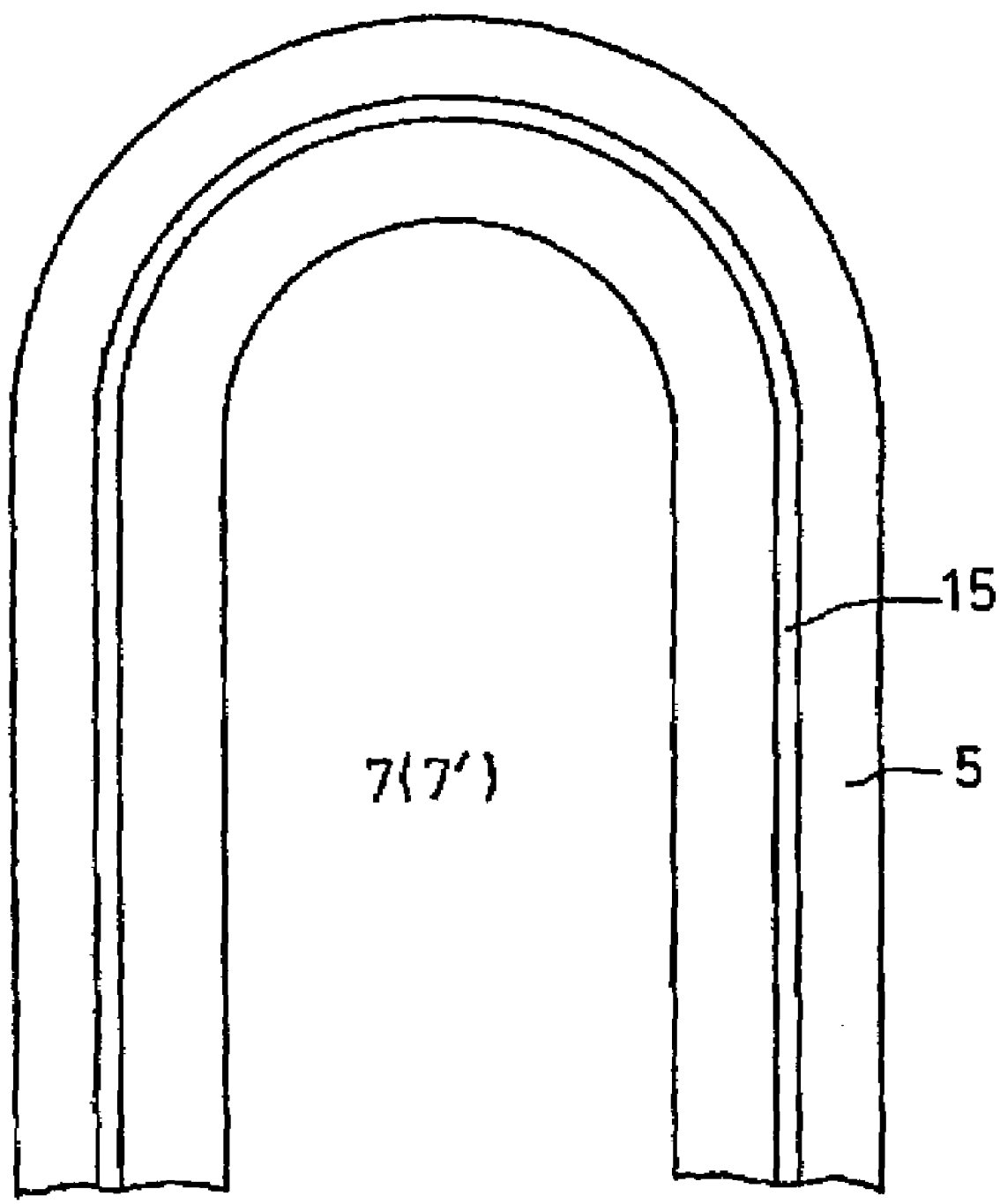
FIG. 31 is a plan view showing the partially enlarged lateral MOSFET shown in FIG. 30.

Boundary regions 24 and 24' between the source region 5 and the drain regions 7 or 7', formed in the surface region of the semiconductor substrate 2, as shown in FIG. 30, have a stripe shape. The boundary regions 24 and 24' meander in the portions above and under the drain electrode pads 10 and 10' shown in FIG. 29 so as to make the boundary regions 24 and 24' longer. Furthermore, on the surfaces of the boundary regions 24 and 24', as shown in FIG. 31, the polysilicon gate electrode 15 in a stripe shape having a width narrower than the boundary regions 24 and 24' is arranged. The gate electrode pads 15 and 15' on the boundary regions 24 and 24' are connected to common gate electrodes 15-2 and 15-2' at the peaks of the meandering part. The common gate electrodes 15-2 and 15-2' are connected to the polysilicon gate electrode pads 15-1 and 15-1', which are separated from each other.

Figure 32:
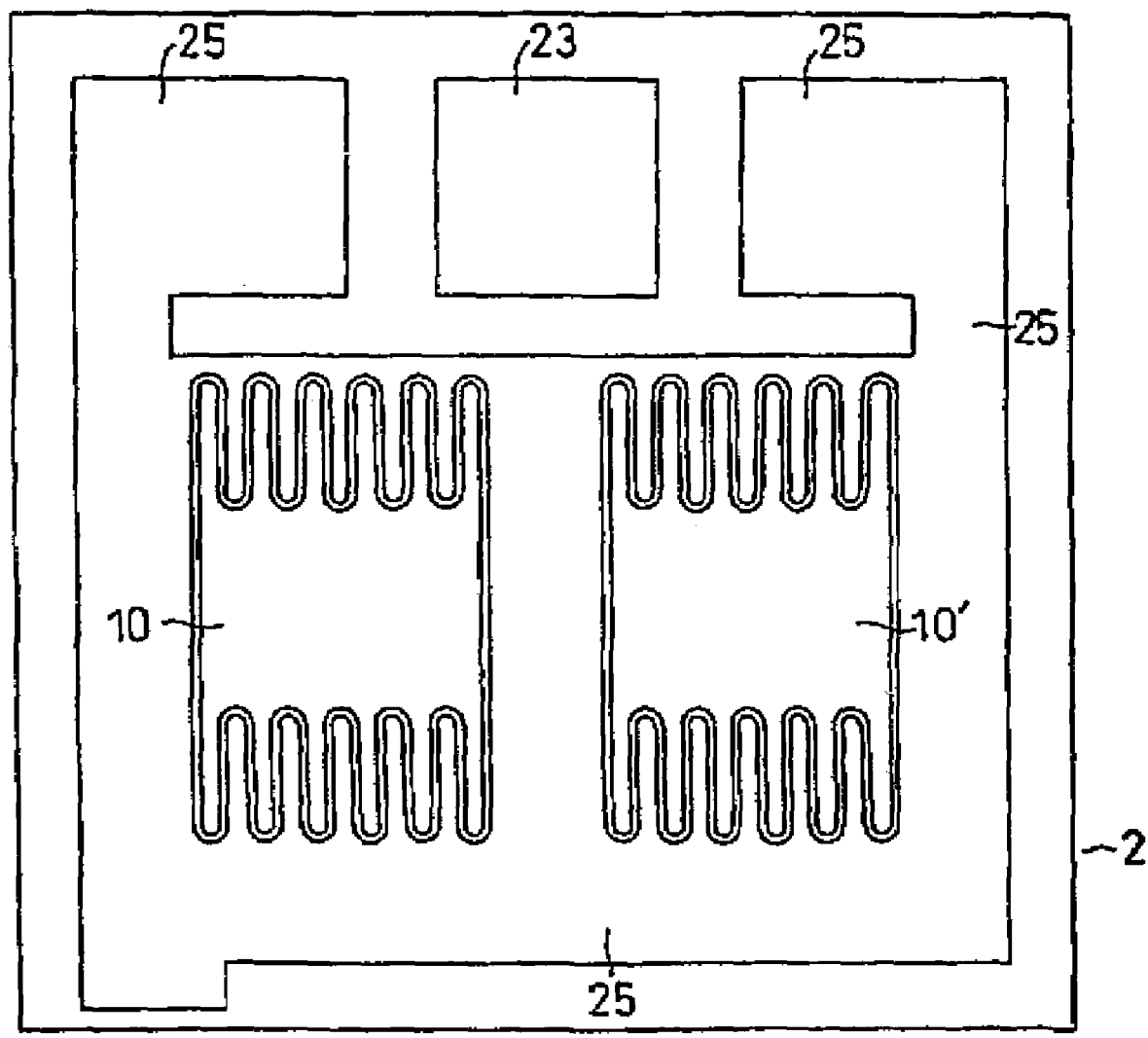
FIG. 32 is a plan view showing aluminum wiring patterns formed on the surface of the lateral MOSFET shown in FIG. 29.

FIG. 32 is a plan view showing aluminum wiring patterns formed on the surface of each semiconductor surface region shown in FIG. 30. On the surface of the source region 5 shown in FIG. 30, a source electrode wire 25 is formed by an aluminum layer extending in the peripheral portion and along the centerline of the semiconductor substrate 2. At the top end of the source electrode wire 25, the source electrode pads 8 and 8' are formed as shown in FIG. 30. At the center of the drain regions 7 and 7' shown in FIG. 30, the drain electrode pads 10 and 10' are formed. And, on the surface of the polysilicon gate electrode pads 15-1 and 15-1' separated from each other as shown in FIG. 30, the gate electrode pad 23 commonly connected to them is formed.

Figure 33A:
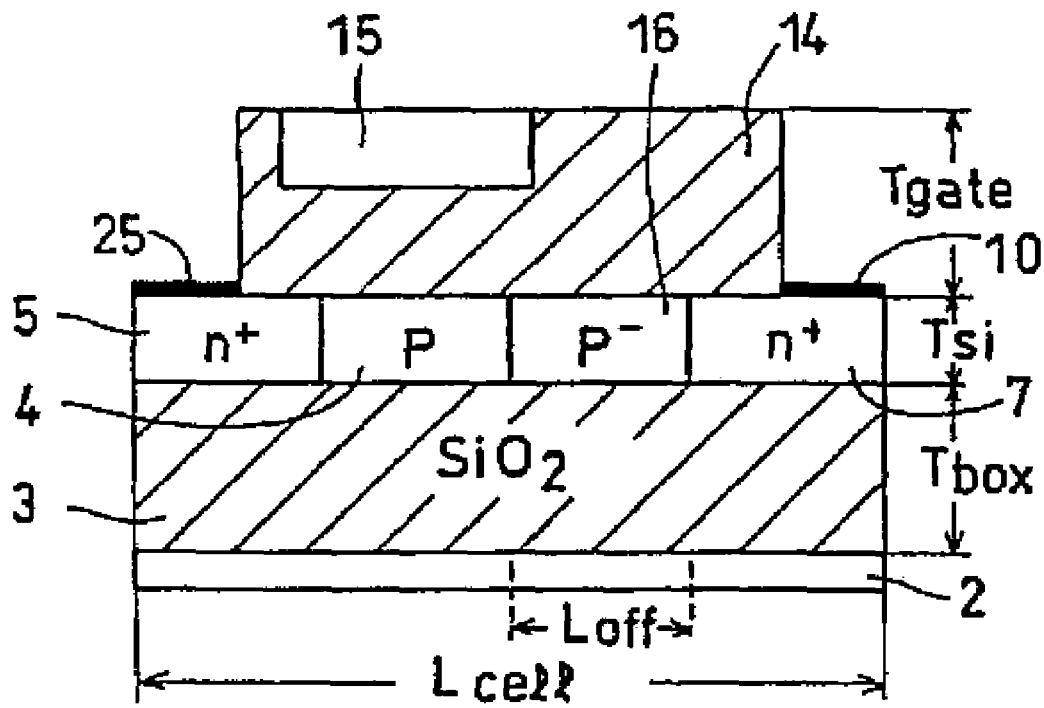
FIG. 33a shows a cross sectional view along a line A-A' shown in FIG. 29
Figure 33B:
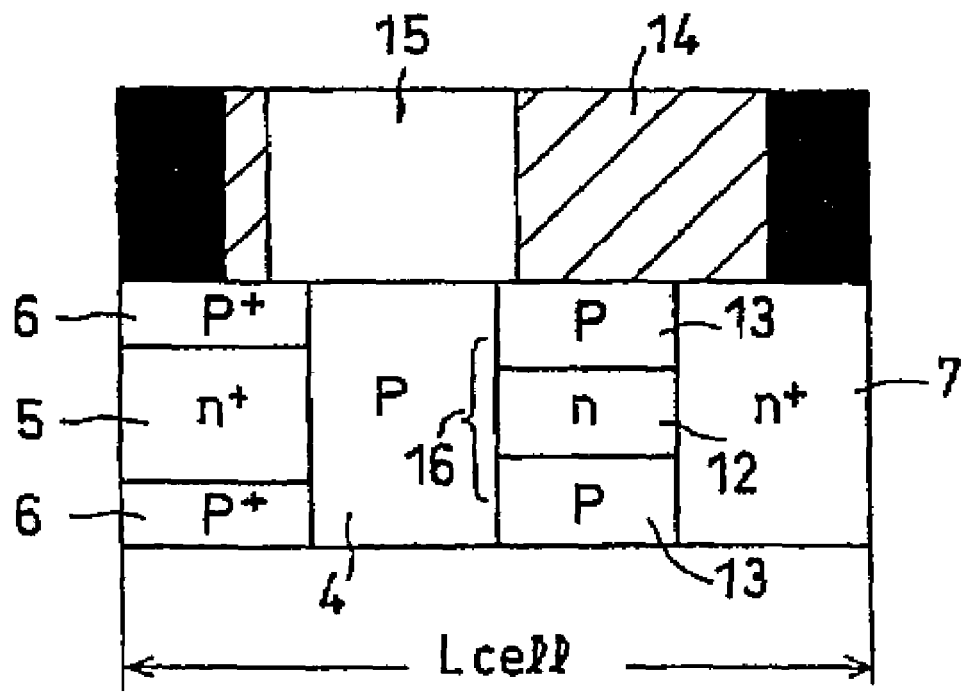
FIG. 33b shows a plan view thereof.

FIG. 33a and FIG. 33b show a structure at a part of a line A-A' crossing the boundary region 24 of the lateral MOSFET shown in FIG. 29, wherein FIG. 33a is a cross sectional view along the line A-A', and FIG. 33b is a plan view in the neighborhood thereof. As shown in FIG. 33a, in the lateral MOSFET, the oxide film 3 composed of oxide silicon is formed on the silicon semiconductor substrate 2. On the oxide film 3, the source region 5 and the drain region 7 are formed on left and right sides. Further, the p-type base layer 4 and the super junction drift layer (hereinafter, referred to as the SJ type drift layer) 16 are formed between the source region 5 and the drain region 7 on the oxide film 3.

The gate oxide film 14 is formed on the source region 5, the p-type base layer 4, the SJ type drift layer 16, and the drain region 7. The gate oxide film 14 is formed so as to partially overlap with the source region 5 and the drain region 7. The drain electrode pad 10 and the source electrode wire 25 are formed on the portions of the source region 5 and the drain region 7, which are not covered by the gate oxide film 14.

The polysilicon gate electrode 15 is formed on the surface of the gate oxide film 14. The polysilicon gate electrode 15 has a width narrower than the width of the gate oxide film 14 and is arranged on the side of the source region 5 so as to form an offset between the polysilicon gate electrode 15 and the drain region 7. In this case, the offset width almost coincides with the width of the SJ type drift layer 16.

FIG. 33b is a plan view showing the gate oxide film 14 and polysilicon gate electrode 15 shown in FIG. 33a, which are partially peeled off. As shown in the drawing, the P+ contact layers 6 are arranged on both sides of the source region 5. Namely, the source layer 5 and the P+ contact layer 6 are alternately arranged in the longitudinal direction of the boundary region 24. Further, the SJ type drift layer 16, as shown in the plan view of FIG. 33b, is composed of the n-type drift layer 12 and the p-type drift layer 13. Namely, the n-type drift layer 12 and the p-type drift layer 13 are alternately arranged in the longitudinal direction of the boundary region 24.

A dimensional example of each unit of the lateral MOSFET having such a structure shown in FIG. 33(a) is indicated below. The thickness Tsi of the SOI layer composed of the source region 5, the p-type base layer 4, the SJ type drift layer 16, and the drain region 7 which are formed on the oxide film 3 is 0.1 μm. The thickness Tgate of the gate oxide film 14 is 0.14 to 0.21 μm. The thickness Tbox of the oxide film 3 formed on the silicon semiconductor. substrate 2 is 3.0 μm. The width of the gate polysilicon pattern is 1.1 to 1.3 μm. The offset length Loff is 0.6 to 2.5 μm. The structural characteristics of the lateral MOSFET described are that firstly the thickness Tsi of the SOI layer is extremely thin, secondary the thickness Tgate, of the gate oxide film 14 is as thick as at least ½ or more of the thickness Tsi of the SOI layer, and thirdly the thickness Tbox of the oxide film 3 is sufficiently thick. With the first characteristic, the SJ type drift layer 16 is depleted even when the bias voltage of the drain region 7 is 0 V, due to the built-in potential in the heat equilibrium state. Further, with the second characteristic, the MOSFET is driven at a higher gate voltage. For example, when the voltage (Vdss) between the source region and the drain region is selected as 20 to 40 V, the gate voltage (Vg) is driven at 30 to 60 V higher than the voltage (Vdss) between the source region and the drain region. Further, with the third characteristic, the substrate capacitance of the drain or source region can be reduced.

In the lateral MOSFET having a structure mentioned above, the output capacitance (Cout) is reduced, and thus the on-state resistance (Ron) between the source region 5 and the drain region 7 can be reduced by the effect of the depleted SJ type drift layer 16, in the same way as in the MOSFET of the embodiments described. Further, in the lateral MOSFET according to the embodiment, the capacitance (Cgd) between the gate electrode and the drain region is reduced, and thus the withstand voltage between the source region and the drain region can be made higher by the offset between the polysilicon gate electrode 15 and the drain region 7. The MOSFET according to the embodiment is driven at a higher gate voltage, so that an effect of easing an increase in the on-state resistance due to the offset structure is obtained. Namely, generally in the MOSFET having the offset structure, a channel layer formed by applying a gate voltage is not reached to the drain electrode due to the existence of the offset in the on-state thereof, so that the on-state resistance is apt to increase. However, in the MOSFET according to the embodiment, an inversion layer (or a storage layer) is formed even in the SJ type drift layer 16 and electrons are stored by application of a high gate voltage, so that it is ascertained that a low on-state resistance (Ron) is obtained as if the source region 5 and the drain region 7 were connected by the channel layer. Moreover, it is ascertained that such an effect (degree of improvement of Vdss and Ron when Cout is made equal) is made greater as the thickness Tgate of the gate oxide film 14 is made thicker and the gate voltage (Vg) is made higher. This respect will be additionally described later.

Figure 34A:
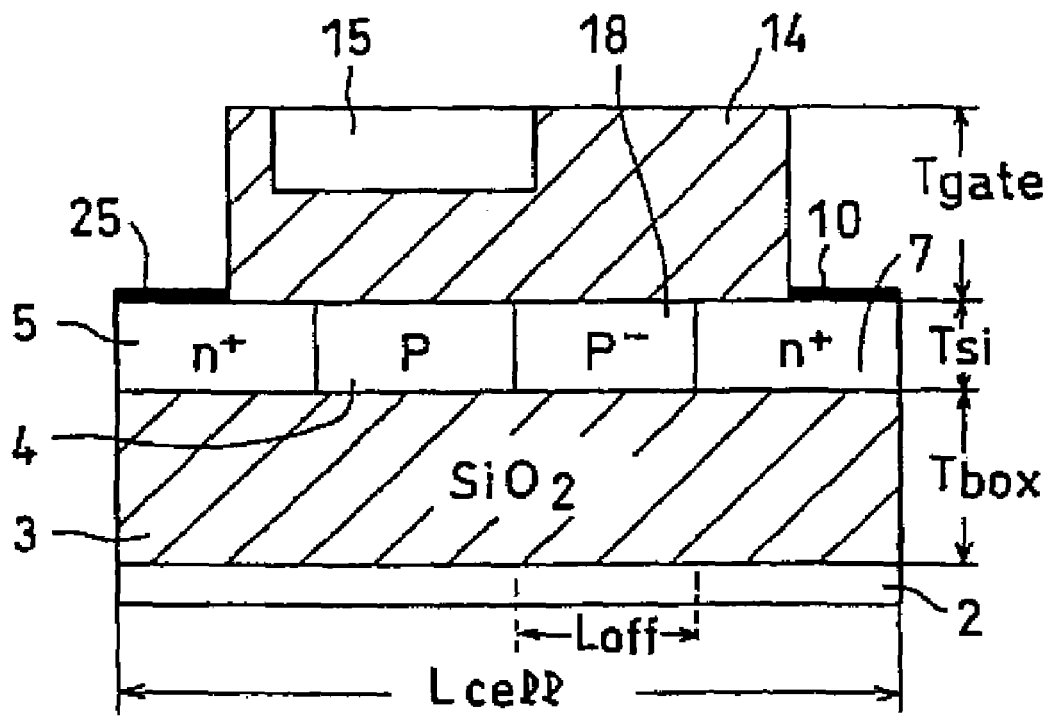
FIG. 34a shows a modified cross sectional view and FIG. 34b shows a modified plan view of FIG. 33.
Figure 34B:
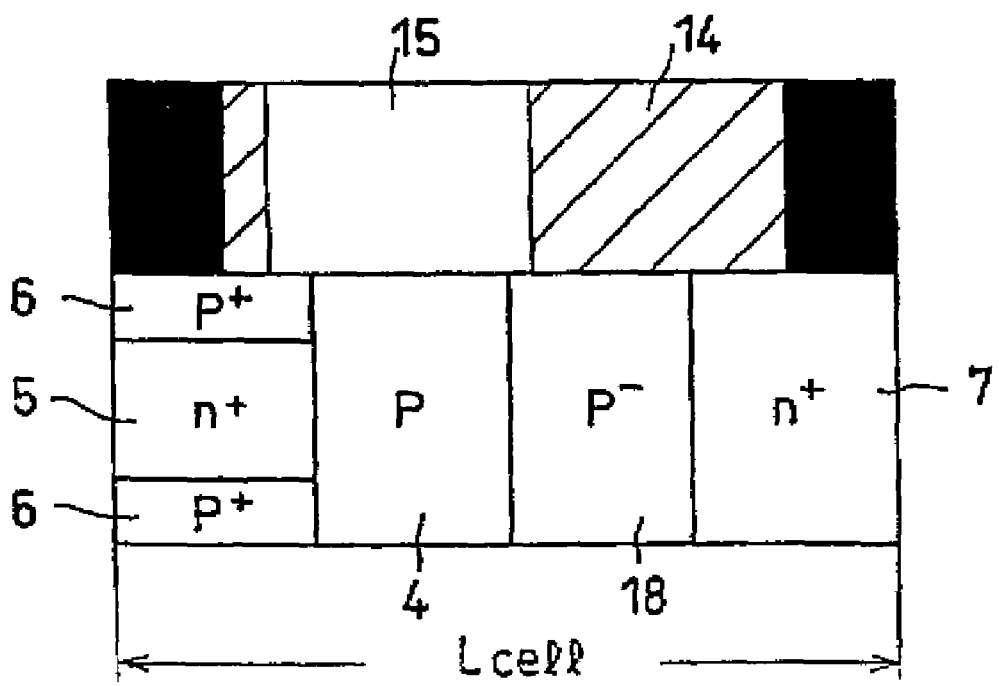

FIG. 34a and FIG. 34b are a plan view showing a modified example of the lateral MOSFET shown in FIG. 33a and FIG. 33b, wherein FIG. 34a is a cross sectional view of the line A-A' shown in FIG. 29, and FIG. 34b is a plan view in the neighborhood thereof. In the lateral MOSFET, in place of the SJ type drift layer 16 shown in FIG. 33, a p-type or n-type drift layer 18 is used. The other portions in the structure are the same as those in the structure of the lateral MOSFET shown in FIG. 34, so that the same parts are assigned with the same numerals and detailed explanation will be omitted.

A dimensional example of each unit of the lateral MOSFET having the structure is indicated in Table 1.

TABLE 1

| Main structural parameters (μm) | |
|---|---|
| SOI layer (Tsi) | 0.1 |
| Berried oxide layer (Tbox) | 3.0 |
| Gate oxide layer (Tgate) | 0.14~0.21 |
| Channel length (Lch) | 1.1~1.3 |
| Offset length (Loff) | 0.6~2.5 |

Namely, the thickness Tsi of the SOI layer composed of the source region 5, the p-type base layer 4, the high-resistance drift layer 16, and the drain region 7 which are formed on the oxide film 3 is 0.1 μm. The thickness Tgate of the gate oxide film 14 is 0.14 to 0.21 μm. The thickness Tbox of the oxide film 3 formed on the silicon semiconductor substrate 2 is 3.0 μm. The width of the gate electrode is 1.1 to 1.3 μm, and the offset length Loff is 0.6 to 2.5 μm. The structural characteristics of the lateral MOSFET are that firstly the thickness Tsi of the SOI layer is extremely thin, secondary the thickness Tgate of the gate oxide film 14 is as thick as at least ½ or more of the thickness Tsi of the SOI layer, and thirdly the thickness Tbox of the oxide film 3 is sufficiently thick.

With the first characteristic, the high resistance drift layer 16 is depleted by the built-in potential in the heat equilibrium state even when the bias voltage of the drain region 7 is 0 V. Further, with the second characteristic, the MOSFET is driven at a higher gate voltage. For example, when the voltage (Vdss) between the source region and the drain region is selected as 20 to 40 V, the gate voltage (Vg) is driven at 30 to 60 V higher than the voltage (Vdss) between the source region and the drain region. Further, with the third characteristic, the substrate capacitance of the drain or source region can be reduced.

In the lateral MOSFET having the structure described, the output capacitance (Cout) is reduced, thus the on-state resistance (Ron) between the source region 5 and the drain region 7 can be reduced by the effect of the depleted high-resistance drift layer 16, in the same way as with the MOSFET of the embodiments described. Further, in the lateral MOSFET according to the embodiment, the capacitance (Cgd) between the gate electrode and the drain region is reduced, and thus the withstand voltage between the source region and the drain region can be made higher by the offset between the polysilicon gate electrode 15 and the drain region 7. The MOSFET according to the embodiment is driven at a higher gate voltage, so that an effect of easing an increase in the on-state resistance due to the offset structure is obtained. Namely, generally in the MOSFET having the offset structure, a channel layer formed at the gate voltage is not connected to the drain electrode due to the existence of the offset in the on state thereof, so that the on-state resistance is apt to increase.

However, in the MOSFET according to the embodiment, an inversion layer (or a storage layer) is formed even in the high-resistance drift layer 16, and electrons are stored by application of a high gate voltage, so that it is ascertained that a low on-state resistance (Ron) is obtained, which is equal to a case as if the source region 5 and the drain region 7 were connected by the channel layer. It is further ascertained that such an effect (improvement effect of Vdss and Ron when Cout is made equal) is made greater as the thickness Tgate of the gate oxide film 14 is made thicker and the gate voltage (Vg) is made higher.

Next, the reason that the polysilicon gate electrode pads 15-1 and 15-1' are separated at least at a portion from each other will be described. The reason is, as mentioned above, to prevent the two lateral MOSFETs 21 and 22 (FIG. 28) mutually connected from being conductive when no bias voltage is applied to the gate electrode 23. Namely, in manufacturing of the aforementioned lateral MOSFET having a extremely thin SOI layer of Tsi, a diffused layer of the SOI element is generally introduced by implantation of impurities after forming the polysilicon wiring. Therefore, the SOI layer right under the polysilicon wiring is left unchanged in its concentration, which is the same concentration of the substrate. The portion of the SOI layer with the substrate concentration can be hardly filled by diffusion in the horizontal direction in case of an extremely thin film element. When the two MOSFETs shown in FIG. 29, in which the drain electrodes and gate electrodes are connected in common are used by applying a voltage between the drain electrodes, a circuit from the drain electrode of one MOSFET to the drain electrode of the other MOSFET is opened through a channel of the Si substrate formed in the SOI layer right under the gate polysilicon wiring. The resistance of this circuit depends on the resistance of the substrate to be used. However, the reliability of the element is questionable in its off state, even if a small current flows through the circuit. Therefore, a structure for closing the circuit formed in the SOI layer under the gate polysilicon wiring is necessary.

In order to install a P+ layer or an insulating slit in the SOI layer under the gate polysilicon wiring, it is necessary to cut the gate polysilicon wiring once at the portion. There is another method available for forming a high-concentration P+ layer or an insulating slit to separate the element at the location where the gate polysilicon wiring is formed, before it is formed. The former method has an advantage that the conventional process can be easily used. The latter method is also available though the number of manufacturing processes is increased.

Figure 35:
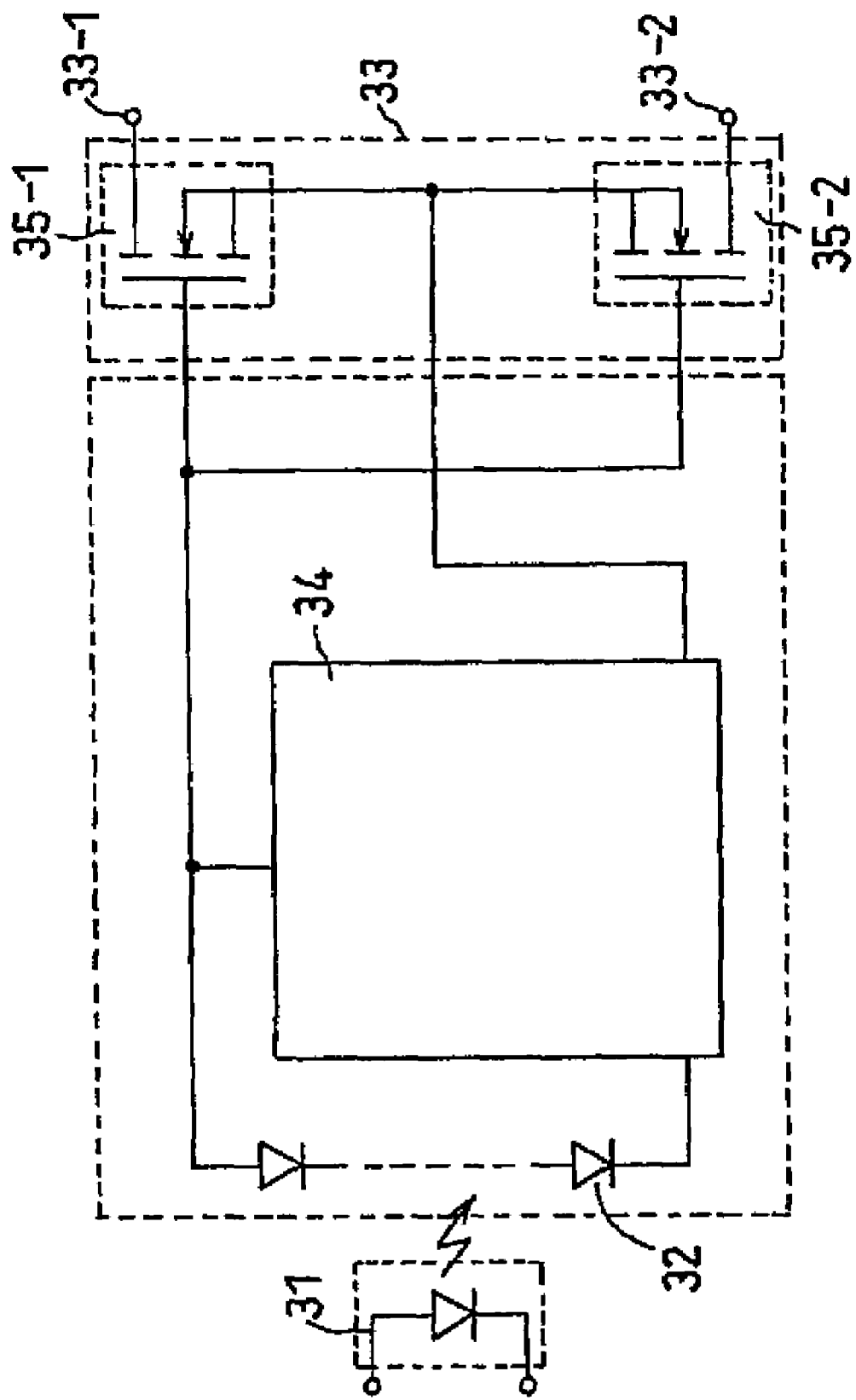
FIG. 35 is a circuit diagram of a photo-relay device to which the lateral MOSFET shown in FIG. 29 is applied.

FIG. 35 is a circuit diagram showing a structure of a photo-relay circuit, to which the lateral MOSFET shown in FIG. 30 is applied. The photo-relay circuit is composed of a light emission element (LED) 31, a photodiode array 32 for generating a voltage by receiving light from the LED 31, a MOSFET circuit 33 driven by the output voltage of the photodiode array 32, and a MOS gate discharge circuit 34 connected between the gate electrode and the source electrode of the MOSFET circuit 33.

The LED 31 emits light by a switching input voltage of several V applied between input terminals 31-1 and 31-2 thereof. The photodiode array 32 is composed of several tens photodiodes connected in series, each of which generates electromotive force of 0.5 to 0.6 V and provides a DC voltage of 30 to 60 V between both ends thereof. The MOSFET circuit 33 is composed of two MOSFETs 35-1 and 35-2 connected in series for example. The MOSFET circuit 33 is the lateral MOSFET shown in FIG. 29. The MOS gate discharge circuit 34 connected between the gate electrode and the source electrode of the MOSFET circuit 33 quickly discharges the charge between the gate electrode and the source electrode, when the MOSFET circuit 33 is to be switched from on state to off state. Output terminals 33-1 and 33-2 of the MOSFET circuit 33 provide switching terminals of the photo-relay circuit.

Then, the operation of the photo-relay circuit will be explained. When the switching input voltage is applied between the input terminals 31-1 and 31-2 of the LED 31, the LED 31 emits light. The light is received by the photodiode array 32 and a high DC voltage is generated between both terminals of the photodiode array 32. The DC voltage is applied between the gate electrode and the source electrode of the two MOSFETs 35-1 and 35-2 included in the MOSFET circuit 33. Thus, the two MOSFETS 35-1 and 35-2 connected are switched from the off state to the on state. The output terminals 33-1 and 33-2 of the MOSFET circuit 33 are then put into a conducting state.

When the switching input voltage applied between the input terminals 31-1 and 31-2 of the LED 31 becomes 0, the LED 31 stops light emission. The DC voltage generated between both terminals of the photodiode array 32 is also extinguished. Therefore, the two MOSFETs 35-1 and 35-2 are switched from the on state to the off state. At this moment, the charge stored between the gate electrode and the source electrode of the MOSFET 35-1 and 35-2 is discharged through the MOS gate discharge circuit 34. In this state, the output terminals 33-1and 33-2 of the MOSFET circuit 33 are in the non-conductive state.

The lateral MOSFET, which is used for the photo-relay circuit is able to realize low output capacitance (Cout) and low on-state resistance (Ron) at the same time. Namely, "figure of merit" (FOM), which indicates the high frequency transmission characteristic of the photo-relay circuit, is represented by the product of output capacitance (Cout) and on-state resistance (Ron). However, in the photo-relay circuit described, FOM of 1.87 pF and 4 pF can be achieved when the voltage (vds) between the source and the drain is 26.5 V and 43 V respectively. The FOM of a conventional photo-rely circuit in practical use is 10 pF at most when the Vds is 40 V.

Table 2 shows data indicating the operation characteristics of the switching lateral MOSFET, which is used for the photo-relay circuit described.

tively indicate a voltage applied between the drain and the source electrodes of the lateral MOSFET and a gate voltage.

Further, a high voltage is used in the photo-relay circuit as a gate voltage for driving the two MOSFETs 35-1 and 35-2 included in the MOSFET circuit 33. However, the gate voltage is generated by the photodiode array 32 and there is no need to supply it from the outside of the photo-relay circuit. Namely, the photodiode array 32 and the MOS gated is charge circuit 34 can be put into one package as a 1-chip IC, so that the input voltage to the photo-relay circuit from the outside may be a switching input voltage of several Volts, which enables to be used as a general low-voltage IC circuit.

Figure 36:
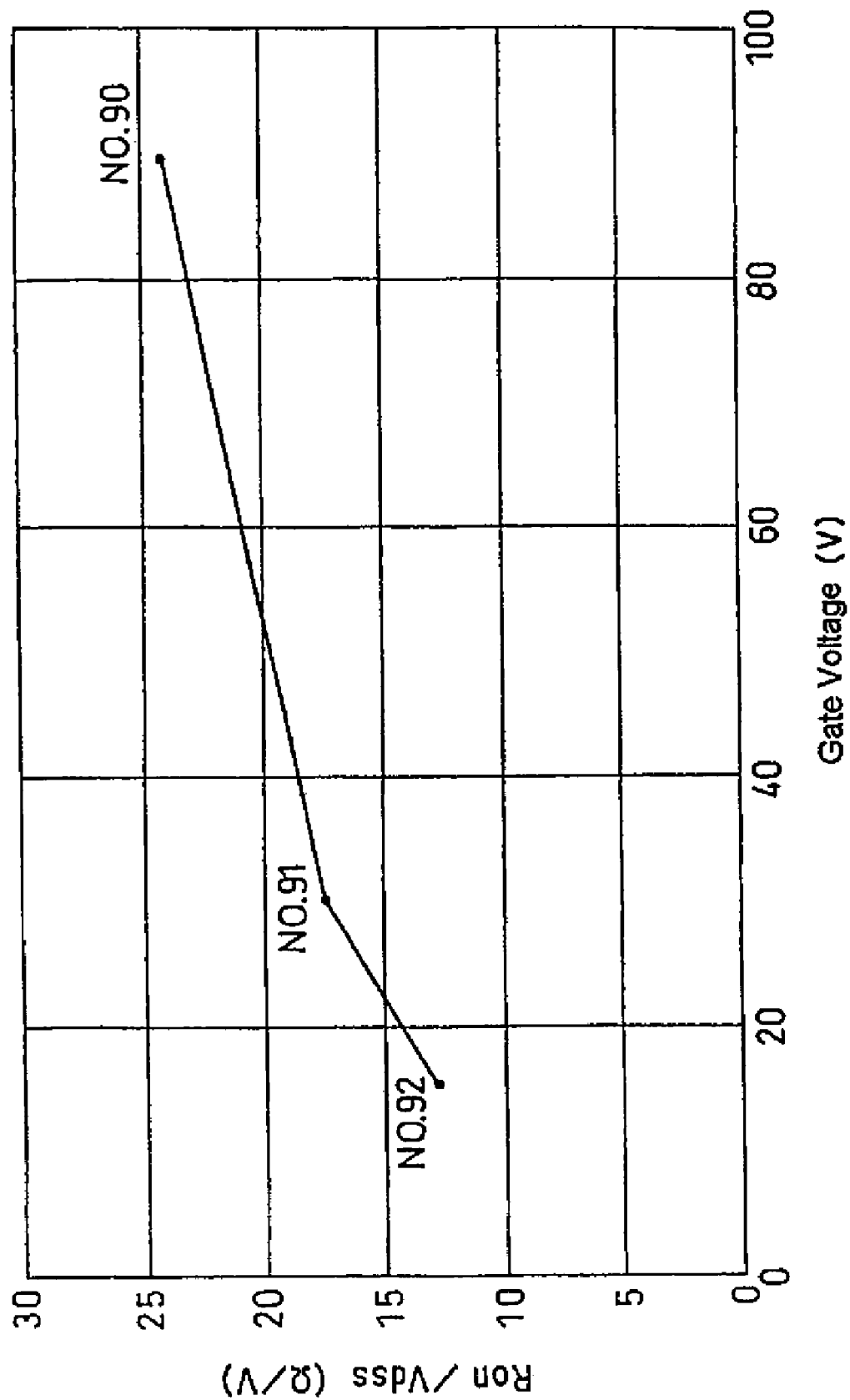
FIG. 36 is a graph for explaining the relationship between the gate drive voltage and the characteristic of the lateral MOSFET shown in FIG. 29.

FIG. 36 is a graph for explaining the relationship between the gate drive voltage of the lateral MOSFET shown in FIG. 29 and the element characteristics. In FIG. 36, the transverse axis indicates the gate oxide film thickness and a value (Vdss/Ron) is plotted, which is obtained by dividing the element withstand voltage (Vdss) by Ron at a gate voltage (for example, can be driven at a gate voltage of 30 V for a gate oxide film thickness of 0.1 μm) in the on state which is proportional to the gate oxide film thickness. The plots Nos. 90, 91, and 92 shown in the drawing indicate comparison of three MOSFET samples having same parameters except for a gate oxide film thickness, which is different from each other. The drawing shows that when Cout is equal, a larger value of Vdss/Ron is better, since the element characteristics can be improved when the gate oxide film is thicker and the drive gate voltage is increased. Further, Table 3 indicates data of each sample shown in FIG. 36.

TABLE 3

| Sample data | | | | | |
|---|---|---|---|---|---|
| Sample | Vdss | Ron | Ron/Vdss | Vgate | Tgate |
| No. 90 | 22 | 0.91 | 24.17582 | 90 | 0.3 |
| No. 91 | 18.18 | 1.04 | 17.48076 | 30 | 0.1 |
| No. 92 | 15.5 | 1.22 | 12.70491 | 15 | 0.05 |
| Unit | V | Ω | Ω/V | V | μm |

One of the characteristics of the lateral MOSFET, as described above, is that the SJ type drift layer 16 is depleted

TABLE 2

| | | Ron(Ω) | | | | Ioff(pA) | | C × R(pF Ω) |
|---|---|---|---|---|---|---|---|---|
| | Voff(V) | Ion = 100 mA | | | | | | |
| SPL | Ioff = 10 nA | Vg = 30 V | Vg = 60 V | Coff(pF) | | Vds = 20 V | Vds = 40 V | Vg = 60 V |
| A(p−) | 26.0 | 3.71 | 2.32 | 0.87 | | 3.85 | — | 2.02 |
| B(SJ) | 26.5 | 3.65 | 2.28 | 0.82 | | 3.75 | — | 1.87 |
| C(p−) | 43.0 | 7.50 | 5.04 | 0.81 | | — | 6.20 | 4.08 |
| Conventional | 45 | 5 | | 2.0 | | | | 10.0 |

In the table, Samples A and B are MOSFET elements of a 20 V system and Sample C is an element of a 40 V system. Further, Sample Conventional is a conventional MOSFET product. Further, in the table, Voff, Ioff, and Coff respectively indicate a voltage, current, and capacitance between the drain and the source electrodes in the off state of the lateral MOSFET. Further, Ion and Ron respectively indicate a current and resistance between the drain and the source electrodes in the on state of the lateral MOSFET. Further, Vds and Vg respecby the built-in potential. The conditions for that purpose are expressed by the following formula.

$$W < \{2\epsilon S \cdot Vbi \cdot (Np+Nn)gNpNn\}^{0.5}$$

$$W = Lp + Ln$$

where
W: pitch of the SJ pattern,
Ln: n-type drift layer 12 (FIG. 33(b)),

Lp: width of the p-type drift layer 3 (FIG. 33(b)),
∈S: dielectric constant of the Si semiconductor,
Vbi: built-in potential between super junction and PN junction, and
q: element charge.

In the fourth embodiment explained above, the polysilicon gate electrodes 15-1 and 15-1' connected to the gate electrode pad 23 of the two lateral MOSFET s 21 and 22 are separated at the portion of the gate electrode pad 23. However, the two lateral MOSFET s may be separated not only at the portion of the gate electrode pad 23 but also, for example, by surrounding the respective peripheries of the two lateral MOSFET s 21 and 22 by a P++ high concentration impurity layer or an insulating layer.

In the various embodiments explained above, a p-type, semiconductor layer is used as an SOI layer. However, the semiconductor layer may be an n-type or non-dope semiconductor layer. Further, an SOI substrate is used as a substrate. However, needless to say, a p-type semiconductor substrate may be used. In a case of an SOI substrate, the capacitance between the drain and the source (substrate) can be reduced, so that lower capacitance can be realized compared with the element in which the SOI structure is not adopted.

Furthermore, the p-type conductivity and the n-type conductivity may be interchanged. The present invention is effectively applied even to other various semiconductor elements having a MOS gate such as IGBT, a planer gate element, or a trench gate element, to reduce the capacitance in the element between the electrodes, thereby effectively moderate the electric field in the field concentrated portion.

Further, it is desirable to optimize the structure taking all of the structures included in the present invention such as the gate oxide film thickness, optimal design between the gate drive voltage and the element withstand voltage, moreover SOI structure, and extremely thin SOI structure into consideration. However, the element characteristics can be improved by adopting some of those structures even if all the structures are not satisfied.

As explained above, the present invention can provide a MOSFET of a structure having a low on-state resistance and low output capacitance at no sacrifice of the element withstand voltage.

Further, a photo-relay capable of surely turning on or off a high-frequency signal can be obtained by using the MOSFET according to the present invention as a photo-relay.

What is claimed is:

1. A semiconductor circuit comprising:
    a field effect transistor including:
    a base layer of a first conductivity type formed on a surface of an insulating substrate,
    a source layer of a second conductivity type selectively formed on the insulating substrate,
    a drain layer of the second conductivity type formed on the insulating substrate apart from the base layer of the first conductivity type,
    a drift layer formed in a region between the base layer and the drain layer,
    a gate electrode formed at least on the surface of the base layer via a gate insulating film, and
    a gate voltage supplying circuit configured to supply a voltage that is equal to or higher than a withstand voltage between the source layer and the drain layer of the field effect transistor, to the gate electrode of the field effect transistor,
    wherein the drift layer has a higher resistance than the base layer formed between the base layer and the drain layer.

2. A semiconductor circuit according to claim 1,
    wherein the drift layer includes a drift layer of a first conductivity type, which extends from the base layer to the drain layer in a region between the base layer and the drain layer; and a drift layer of a second conductivity type, which is formed together with the drift layer of the first conductivity type.

3. A semiconductor circuit according to claim 2,
    wherein the drift layer of the first conductivity type and the drift layer of the second conductivity type are alternately arranged.

4. A semiconductor circuit according to claim 3,
    wherein a repetitive pitch of the drift layer of the first conductivity type and the drift layer of the second conductivity type is within a range from 0.01 µm to 5 µm.

5. A semiconductor circuit according to claim 2,
    wherein the drift layer of the first conductivity type and the drift layer of the second conductivity type are respectively formed in a striped shape.

6. A semiconductor circuit according to claim 2,
    wherein a dose of the drift layer of the second conductivity type is within a range from $1.0 \times 10^{11}$ to $6.0 \times 10^{13}$ cm$^{-2}$.

7. A semiconductor circuit according to claim 2,
    wherein impurity concentration of the drift layer of the first conductivity type is selected to be practically higher on a source side than on a drain side and impurity concentration of the drift semiconductor layer of the second conductivity type is selected to be practically higher on the drain side than on the source side.

8. A semiconductor circuit according to claim 1,
    wherein the drift layer is a super junction drift layer comprising a drift layer of a first conductivity type formed between the base layer and the drain layer and a drift layer of a second conductivity type formed together with the drain layer in a direction perpendicular to a direction from the source layer to the drain layer.

9. A semiconductor circuit according to claim 1,
    wherein a low-resistance layer having lower resistance than the base layer is formed in contact with the base layer and the low-resistance layer of the first conductivity type and the source layer are alternately arranged in a direction almost perpendicular to a direction from the source layer to the drain layer.

10. A semiconductor circuit according to claim 9, wherein the gate electrode is provided with an offset between the gate electrode and the drain layer.

11. A semiconductor circuit according to claim 1,
    wherein a thickness of the gate oxide film is larger than about ½ the thickness of an SOI layer composed of the base layer, the source layer, the drain layer, and the high-resistance drift layer, which are formed on the insulating substrate surface.

12. A semiconductor circuit according to claim 11,
    wherein a thickness of the insulating layer is larger than the thickness of the gate oxide film or the thickness of the SOI layer.

13. A semiconductor circuit according to claim 1,
    wherein the gate electrode includes a pair of gate electrodes, which are provided above and under the drift layer.

14. A semiconductor circuit according to claim 1,
    wherein the base layer, the drain layer and the drift layer are formed in a pillar shape on the insulating substrate, in which the drift layer is formed between the base layer and the drain layer, and the gate electrode is so provided as to hold both sides of the pillar shaped layers.

15. A semiconductor circuit comprising:
a field effect transistor including:
a base layer of a first conductivity type,
a source layer of a second conductivity type selectively formed on an insulating substrate,
a drain layer of the second conductivity type formed apart from the base layer of the first conductivity type,
a drift layer formed in a region between the base layer and the drain layer,
a gate electrode formed at least on the surface of the base layer via a gate insulating film, and
a gate voltage supplying circuit configured to supply a voltage that is equal to or higher than a withstand voltage between the source layer and the drain layer of the field effect transistor, to the gate electrode of the field effect transistor,
wherein the drift layer has a higher resistance than the base layer formed between the base layer and the drain layer.

16. A semiconductor circuit according to claim 15, wherein the drift layer is of a first conductivity type.

17. A semiconductor circuit according to claim 1, wherein the drift layer is of a first conductivity type.

18. A semiconductor circuit according to claim 1, wherein the drift layer is of a second conductivity type.

* * * * *